US007979759B2

(12) United States Patent
Carnevale et al.

(10) Patent No.: US 7,979,759 B2
(45) Date of Patent: Jul. 12, 2011

(54) TEST AND BRING-UP OF AN ENHANCED CASCADE INTERCONNECT MEMORY SYSTEM

(75) Inventors: Michael J. Carnevale, Rochester, MN (US); Elianne A. Bravo, Wappingers Falls, NY (US); Kevin C. Gower, LaGrangeville, NY (US); Gary A. Van Huben, Poughkeepsie, NY (US); Donald J. Ziebarth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 12/350,306

(22) Filed: Jan. 8, 2009

(65) Prior Publication Data

US 2010/0174955 A1    Jul. 8, 2010

(51) Int. Cl.
  *G11C 29/00* (2006.01)
(52) U.S. Cl. ............... 714/718; 714/5; 714/25; 714/29; 714/30; 714/42; 714/43; 714/45; 714/48; 714/52; 714/712; 714/713; 714/715; 714/719; 714/723; 714/733; 714/734; 714/736; 714/741; 714/746; 714/799; 710/316; 702/117; 703/13; 703/14; 703/15; 703/23; 716/4; 716/16; 365/201
(58) Field of Classification Search .................. None
  See application file for complete search history.

(56) References Cited

U.S. PATENT DOCUMENTS

| 4,034,195 A | 7/1977 | Bates |
| 4,376,306 A | 3/1983 | Giusto |
| 4,468,770 A | 8/1984 | Metcalf et al. |
| 4,631,686 A | 12/1986 | Ikawa et al. |
| 4,644,498 A | 2/1987 | Bedard et al. |
| 4,775,979 A | 10/1988 | Oka |
| 5,321,813 A | 6/1994 | McMillen et al. |
| 5,513,135 A | 4/1996 | Dell et al. |
| 6,067,262 A | 5/2000 | Irrinki et al. |
| 6,070,256 A | 5/2000 | Wu et al. |
| 6,119,181 A | 9/2000 | Vorbach et al. |
| 6,147,967 A | 11/2000 | Ying et al. |

(Continued)

FOREIGN PATENT DOCUMENTS

EP    1622020 A2    2/2006

(Continued)

OTHER PUBLICATIONS

G. Boudon et al., "Novel Bus Reconfiguration Scheme With Spare Lines", IBM Technical Bulletin, May 1987, pp. 5590-5593.

(Continued)

*Primary Examiner* — John P Trimmings
(74) *Attorney, Agent, or Firm* — Cantor Colburn LLP

(57) ABSTRACT

A memory hub device with test logic is configured to communicate with memory devices via multiple hub device ports, and is also configured to communicate on one or more busses in an upstream and downstream direction. The test logic includes a built-in self test apparatus providing logic to simultaneously and independently test the memory devices interfaced to one or more of the hub device ports using read and write data patterns. The test logic also includes configuration registers to hold fault and diagnostic information, and to initiate one or more tests. The memory hub device can further include command collision detection logic, a trace array, buffer transmit mode logic, trigger logic, clock adjustment logic, transparent mode logic, and a configured command sequencer, as well as additional features.

9 Claims, 13 Drawing Sheets

U.S. PATENT DOCUMENTS

| | | | |
|---|---|---|---|
| 6,297,995 | B1 | 10/2001 | McConnell et al. |
| 6,308,286 | B1 | 10/2001 | Richmond et al. |
| 6,337,817 | B1 | 1/2002 | Horiguchi et al. |
| 6,338,154 | B2 | 1/2002 | Kim |
| 6,367,042 | B1 | 4/2002 | Phan et al. |
| 6,381,685 | B2 | 4/2002 | Dell et al. |
| 6,518,593 | B2 | 2/2003 | Takabayashi et al. |
| 6,526,461 | B1 | 2/2003 | Cliff |
| 6,531,339 | B2 | 3/2003 | King et al. |
| 6,789,212 | B1 | 9/2004 | Klingman |
| 6,895,528 | B2 | 5/2005 | Cantwell et al. |
| 6,931,564 | B2 | 8/2005 | Goodman et al. |
| 6,973,605 | B1 | 12/2005 | Templeton et al. |
| 7,013,416 | B2 | 3/2006 | Whetsel |
| 7,058,918 | B2 | 6/2006 | Abramovici et al. |
| 7,069,494 | B2 | 6/2006 | Cargnoni et al. |
| 7,154,723 | B1 | 12/2006 | Warnakulasooriya et al. |
| 7,168,005 | B2 | 1/2007 | Adams et al. |
| 7,178,076 | B1 | 2/2007 | Zarrineh et al. |
| 7,181,659 | B2 * | 2/2007 | Bravo et al. .............. 714/718 |
| 7,277,346 | B1 | 10/2007 | Rahim et al. |
| 7,299,313 | B2 | 11/2007 | Gower et al. |
| 7,334,149 | B1 | 2/2008 | Wu |
| 7,353,316 | B2 * | 4/2008 | Erdmann .............. 710/316 |
| 7,362,697 | B2 | 4/2008 | Becker et al. |
| 2002/0024455 | A1 | 2/2002 | Abbiate et al. |
| 2002/0075982 | A1 | 6/2002 | Doblar |
| 2003/0074619 | A1 | 4/2003 | Dorsey |
| 2003/0185251 | A1 | 10/2003 | Ichino et al. |
| 2004/0180455 | A1 | 9/2004 | Marr |
| 2004/0190331 | A1 | 9/2004 | Ross et al. |
| 2004/0216026 | A1 | 10/2004 | Ferraiolo et al. |
| 2004/0250181 | A1 * | 12/2004 | Vogt et al. .............. 714/718 |
| 2005/0138496 | A1 | 6/2005 | Brennan et al. |
| 2005/0174138 | A1 | 8/2005 | Marr |
| 2005/0210185 | A1 | 9/2005 | Renick |
| 2005/0223196 | A1 | 10/2005 | Knowles |
| 2005/0246597 | A1 | 11/2005 | Whetsel |
| 2006/0036827 | A1 * | 2/2006 | Dell et al. .............. 711/167 |
| 2006/0095620 | A1 * | 5/2006 | Dreps et al. .............. 710/100 |
| 2006/0107175 | A1 * | 5/2006 | Dell et al. .............. 714/758 |
| 2006/0179369 | A1 * | 8/2006 | Bravo et al. .............. 714/718 |
| 2006/0179394 | A1 | 8/2006 | O'Neill et al. |
| 2006/0218455 | A1 | 9/2006 | LeClair et al. |
| 2006/0277363 | A1 | 12/2006 | Qiu et al. |
| 2007/0011562 | A1 * | 1/2007 | Alexander et al. .............. 714/758 |
| 2007/0075734 | A1 | 4/2007 | Ramos et al. |
| 2007/0204190 | A1 * | 8/2007 | Hesse et al. .............. 714/718 |
| 2007/0283223 | A1 | 12/2007 | Dell et al. |
| 2007/0288816 | A1 | 12/2007 | Nakanishi |
| 2007/0300129 | A1 * | 12/2007 | Dell et al. .............. 714/764 |
| 2008/0005644 | A1 | 1/2008 | Dell |
| 2008/0022186 | A1 | 1/2008 | Co et al. |
| 2008/0028345 | A1 | 1/2008 | Suri et al. |
| 2008/0046774 | A1 | 2/2008 | Hirai et al. |
| 2008/0046796 | A1 | 2/2008 | Dell et al. |
| 2008/0065938 | A1 | 3/2008 | Cowell et al. |
| 2008/0115137 | A1 | 5/2008 | Gower et al. |
| 2010/0153794 | A1 * | 6/2010 | Jeddeloh .............. 714/718 |

FOREIGN PATENT DOCUMENTS

| | | |
|---|---|---|
| JP | 02-307254 | 12/1990 |
| JP | 03-234125 | 10/1991 |
| JP | 09-261210 | 10/1997 |

OTHER PUBLICATIONS

Sunggu Lee, et al., "Probabilistic Diagnosis of Multiprocessor Systems", ACM Computing Surveys, Mar. 1994, pp. 121-139, vol. 26, No. 1.

Alan Charlesworth et al., "The Starfire SMP Interconnect", 1997, pp. 1-20, ACM.

Daniele Rossi et al., "New ECC for Crosstalk Impact Minimization", Jul./Aug. 2005, pp. 340-348 IEEE CS and the IEEE CASS.

Smitha Shyam et al., "Ultra Low-Cost Defect Protection for Microprocessor Pipelines", ASPLOS' 06, Oct. 21-25, 2006, pp. 73-82, ACM, San Jose, California, USA.

D.M Berger et al., "High-Speed source-synchronous interface for the IBM System z9 processor" IBM J. Res & Dev., Jan. 2007, pp. 53-64, vol. 51, No. 1/2, IBM.

FBDIMM: Architecture and Protocal, Jan. 2007, JESD206, JEDEC Solid State Technology Association, Arlington, VA USA.

* cited by examiner

CONFIGURATION REGISTERS 414

| ERROR REGISTERS | 1000 |
|---|---|
|     RNKFIR0 - RANK ERROR INFORMATION FOR RANKS 0:7 | 1012 |
|     RNKFIR1 - RANK ERROR INFORMATION FOR RANKS 8:15 | 1014 |
|     CSMFIR - GENERAL ERRORS | 1016 |
|     FIR - GENERAL CHIP ERRORS | 1018 |
|     FIR1 - GENERAL CHIP ERRORS | 1020 |
|     FIR2 - GENERAL CHIP ERRORS | 1022 |
| MAINTENANCE COMMAND REGISTERS | 1002 |
| MASK REGISTERS | 1004 |
| STATUS REGISTERS | 1006 |
| MEMORY DEVICE REGISTERS | 1008 |

⋮

| MODE REGISTERS | 1010 |
|---|---|

FIG. 10

TEST AND BRING-UP OF AN ENHANCED CASCADE INTERCONNECT MEMORY SYSTEM

BACKGROUND

This invention relates generally to computer memory systems, and more particularly to test, initial bring-up, characterization and validation of a memory subsystem designed for use in a high-speed, high-reliability cascade interconnect memory system.

Contemporary high performance computing memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, reduced latency, increased storage, lower operating costs, etc. Other frequent customer requirements further exacerbate the memory system design challenges, and include such items as ease of upgrade and reduced system environmental impact (such as space, power and cooling).

As computer memory systems increase in performance and density, new challenges continue to arise which add significant levels of difficulty and increase the time required for initial bring-up, characterization and/or design validation of one or more memory system elements (e.g., high speed interface(s), hub device functionality, buffered memory modules, memory device interface(s), etc). Higher DRAM operating frequencies, especially when coupled to intermediary devices such as hub devices, buffer devices, register devices, etc via high speed bus(es) may prevent use of conventional test equipment to characterize memory systems and subsystems during both tester-based and system bring-up and operation—as the high speed bus(es) and memory device interfaces may not properly transfer information when known probing methods are used within the subsystem and/or system environment(s). In addition, traditional hardware and software diagnostic methods may also be of limited value given the complexity and large number of operations performed during bring-up and initial memory operations—including such operations as power supply activation (often with varying voltage ramp rates), power supply sequencing (e.g., the time relationship between and relative ramp rates of the various voltages utilized by the memory system), capture of initial subsystem characteristics (e.g., via Serial Presence Detects or other methods) by the controller or test environment, device reset operations, initial communications over untrained high speed bus(es), completion of the training of high speed bus(es), device initialization(s), determination of appropriate values and the setting of initial device configuration information for all programmable devices, the completion of initial diagnostics to attached device(s), etc. With the breadth of tasks involved in initial bring-up of the memory subsystem separately and/or within the memory system environment, the addition of tight timing margins and small signal swings further challenge traditional test and software diagnostic methods for analyzing and reporting fault and/or marginal operational conditions and will generally result in far too much data and limited "root-cause" failure indications—thereby dramatically increasing and complicating the time and effort required to complete initial bring-up, characterization and design validation of new memory structures under the range of operating conditions for which the memory structures are intended to reliably function.

SUMMARY

An exemplary embodiment is a memory hub device with test logic. The memory hub device is configured to communicate with memory devices via multiple hub device ports. The memory hub device is also configured to communicate on one or more busses in an upstream and downstream direction. The test logic includes a built-in self test apparatus providing logic to simultaneously and independently test the memory devices interfaced to one or more of the hub device ports using read and write data patterns. The test logic also includes configuration registers to hold fault and diagnostic information, and to initiate one or more tests. The memory hub device may further include command collision detection logic, a trace array, buffer transmit mode logic, trigger logic, clock adjustment logic, transparent mode logic, and a configured command sequencer, as well as additional features described in greater detail herein.

Another exemplary embodiment is a method of testing an enhanced cascade interconnected memory system. The method includes receiving one or more commands at a memory hub device from one or more of: a downstream bus, an upstream bus, and a service interface. The method further includes configuring one or more configuration registers to initiate one or more tests in response to the one or more commands. The one or more commands may target one or more of: memory devices interfaced to two or more hub device ports of the memory hub device as one or more of simultaneous and independent tests, a downstream memory hub device cascade interconnected to the downstream bus, and an upstream memory hub device cascade interconnected to the upstream bus. The method also includes reporting one or more results of the one or more tests.

A further exemplary embodiment is a memory hub device with test logic. The memory hub device is configured to communicate with memory devices via multiple hub device ports. The memory hub device is also configured to communicate on one or more busses in an upstream and downstream direction. The test logic includes a configured command sequencer to launch an architected command to a target device configurable between local execution of the architected command at the memory hub device and remote execution at one or more of: a downstream memory hub device and an upstream memory hub device. The memory hub device further includes configuration registers to hold fault and diagnostic information, and to initiate one or more tests.

An additional exemplary embodiment is a design structure tangibly embodied in a machine-readable medium for designing, manufacturing, or testing an integrated circuit. The design structure includes a configured command sequencer to launch an architected command to a target device configurable between local execution of the architected command at a memory hub device and remote execution at one or more of:

a downstream memory hub device and an upstream memory hub device. The design structure further includes and configuration registers to hold fault and diagnostic information, and to initiate one or more tests.

Other systems, methods, apparatuses, and/or design structures according to embodiments will be or become apparent to one with skill in the art upon review of the following drawings and detailed description. It is intended that all such additional systems, methods, apparatuses, and/or design structures be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES:

FIG. 10 illustrates an example of configuration registers to support test and bring up in exemplary embodiments;

DETAILED DESCRIPTION

The invention as described herein provides for the test, bring-up, initial characterization and/or functional validation of a memory system supporting enhanced cascade interconnections. Interposing a memory hub device as a memory interface device between a memory controller and memory devices enables a flexible high-speed operation and communication protocol with error detection to be implemented. Efficiency gains may be achieved by the intermixing of command and data streams instead of utilizing a fixed bandwidth allocation between commands and data. The protocol allows a high-speed memory channel to operate at one or more fixed frequencies, which are a variable multiple of the memory device clock frequency. Flexibility is increased by using variable frame formats to maximize utilization of available communication bandwidth at a selected ratio between the high-speed bus and memory device clock frequencies. Multiple memory hub devices can be cascade interconnected and/or connected via other means such as a multi-drop net to expand system capacity. Each memory hub device can support one or more memory subsystem configurations using multiple ports. For example, the ports of a memory hub device can be configured to interface directly with one or more ranks of memory devices directly connected to the hub device and/or connected by way of connectors to separate assemblies comprised of memory devices (e.g. Unbuffered DIMMs (UDIMMs)), registers and memory devices of industry-standard registered dual in-line memory modules (RDIMMs) and other module types. Moreover, memory hub devices can be attached to a system board (e.g. a system planar), a card assembly and/or integrated on memory module (e.g., a single or dual-sided DIMM). The memory hub devices may also support dynamic sparing to switch out one or more failed segments included in various communication busses.

To support testing during normal power-up, as well as in a lab environment (e.g., bring-up and debug from initial design prototypes to final products), memory hub devices can include and employ a variety of testing and debug features. In an exemplary embodiment, a memory hub device includes test logic and storage, such as: memory built-in self test (MBIST), a configured command sequencer (CCS), command collision detection (CCD) logic, a trace array, trigger logic, transparent mode logic, logic analyzer interface (LAI) mode logic, configuration registers, and buffer transmit mode (BTM) logic. The memory hub device also includes various communication and control interfaces to access memory devices (e.g., DRAMs), a memory controller and other memory hub devices, as well as interfacing with test and service equipment. Further details are provided herein.

Figure 1:
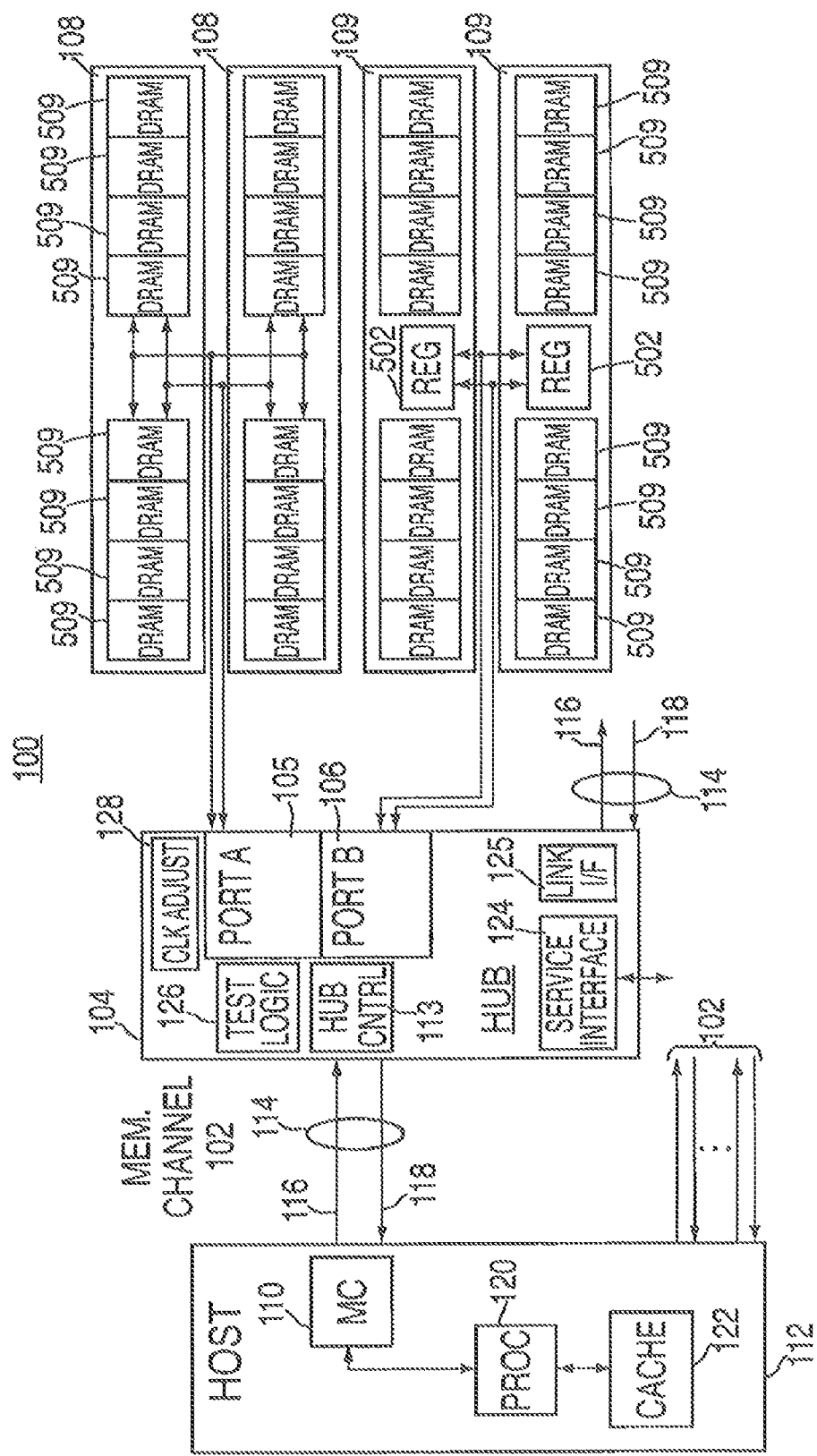
FIG. 1 depicts a memory system which includes a hub device interfacing with multiple memory modules communicating via a memory channel comprised of high-speed upstream and downstream buses that may be implemented by exemplary embodiments.

Turning now to FIG. 1, an example of a memory system 100 is shown which includes one or more host memory channels 102 wherein any of the one or more channels may be connected to one or more cascaded memory hub devices 104 is depicted in a planar configuration. Each memory hub device 104 may include one or more synchronous dynamic random access memory (SDRAM) ports (e.g., two memory ports A 105 and port B 106—also referred to a "hub device ports" or simply "ports") connected to one or more unbuffered memory modules (UDIMMs) 108, registered DIMMs (RDIMMs) 109, buffered memory modules or other arrangements of memory devices known in the art or yet to be devised. For example, the memory modules 108 and the RDIMMs 109 can include multiple memory devices 509, such as a version of double data rate (DDR) dynamic random access memory (DRAM), e.g., DDR1, DDR2, DDR3, DDR4, etc. In an exemplary embodiment, the memory devices 509 are DDR3 synchronous DRAMs. Storage within the memory devices 509 may be further subdivided into multiple banks, e.g., to reduce device latency and/or increase useable bandwidth. The memory devices 509 on the unbuffered memory modules (UDIMMs) 108 and/or the RDIMMs 109 may be organized as one or more ranks, where each rank is a group of memory devices 509 that can be accessed together. The pair of UDIMMs 108 depicted in FIG. 1 may use a pair of sockets (e.g., coupling interfaces) to communicate with port A 105. Similarly, the pair of RDIMMs 109 depicted in FIG. 1 may also use a pair of sockets to communicate with port B 106. Sockets can support plugging in and removing the UDIMMs 108 and/or the RDIMMs 109 in the memory system 100.

In the example of FIG. 1, the exemplary memory hub device 104 can send address, commands and/or control signals, transfer read and write data, provide clocking signal(s) and control timing to the memory devices 509 of memory modules 108 via port A 105. The RDIMMs 109 may interface to port B 106 via one or more of direct connections to the memory devices and via register/phase locked loop (PLL) devices 502 to send address, commands and/or control signals, transfer read and write data, provide clocking signal(s) and control timing on the RDIMMs 109. Although the example of FIG. 1 depicts port A 105 interfaced to unbuffered memory modules 108, while port B 106 is interfaced to RDIMMs 109, the scope of the invention is not so limited. Ports A 105 and B 106 can both support multiple memory arrangements and modules/assemblies, such as the UDIMMs 108 and RDIMMs 109.

The memory channel 102 carries information to and from a memory controller 110 in host processing system 112. The memory channel 102 may transfer data at rates upwards of 6.4 Gigabits per second per pin. The hub control logic 113 in the memory hub device 104 can translate the information from a high-speed reduced pin count bus 114 which enables communication to and from the memory controller 110 of the host processing system 112 to lower speed, wide, bidirectional ports A 105 and B 106 to support low-cost industry standard memory, thus the memory hub device 104 and the memory controller 110 may both be generically referred to as communication interface devices or memory interface devices. The exemplary bus 114 includes downstream link segments 116 and upstream link segments 118 as unidirectional links between devices in communication over the bus 114. The term "downstream" indicates that the data is moving from the host processing system 112 to the memory devices 509 of the UDIMMs 108 and/or RDIMMs 109. The term "upstream" refers to data moving from the memory devices 509 of the UDIMMs 108 and/or RDIMMs 109 to the host processing system 112. The information stream coming from the host processing system 112 can include a mixture of information such as address(es), controls, commands and data to be stored in the UDIMMs 108 and/or RDIMMs 109 as well as redundancy information (e.g., ECC, parity, CRC and/or other information) which allows for reliable transfers. The information returning to the host processing system 112 can include data retrieved from the memory devices 509 on the UDIMMs 108 and/or RDIMMs 109 as well as redundant information for reliable transfers, error information, status information and/or other information requested by and/or of interest to the host processing system. Information such as address, commands and data can be initiated in the host processing system 112 using processing elements known in the art, such as one or more processors 120 and cache memory 122. The memory hub device 104 can also include additional communication interfaces, for instance, a service interface 124 to initiate special test modes of operation and/or to send and/or receive error, status and/or other information that may assist in configuring, testing and diagnosing the memory hub device 104 and/or attached memory modules, devices, interfaces, etc. via test logic 126. The test logic may also be responsive to addresses, commands, controls and/or data received on link interface 125 that handles communications on the bus 114. The memory hub device 104 also includes clock adjust logic 128 to control clocking ratios between the high-speed communications of bus 114 and (generally but not limited to) slower communications via ports A 105 and B 106.

In an exemplary embodiment, the memory controller 110 has a very wide, high bandwidth connection to one or more processing cores of the processor 120 and cache memory 122. This enables the memory controller 110 to initiate and/or monitor both actual and predicted future data requests to the memory channel 102. Based on the current and predicted processor 120 and cache memory 122 activity, the memory controller 110 determines a sequence of commands to best utilize the attached memory resources to service the demands of the processor 120 and cache memory 122. This stream of commands, addresses and/or controls are mixed together with data that is written to the memory devices 509 in units called "frames". The memory hub device 104 receives and interprets the frames as formatted by the memory controller 110, translating and/or converting the contents of the frames into a format compatible with attached memory devices and/or memory modules such as UDIMMs 108 and/or RDIMMs 109.

Figure 2:
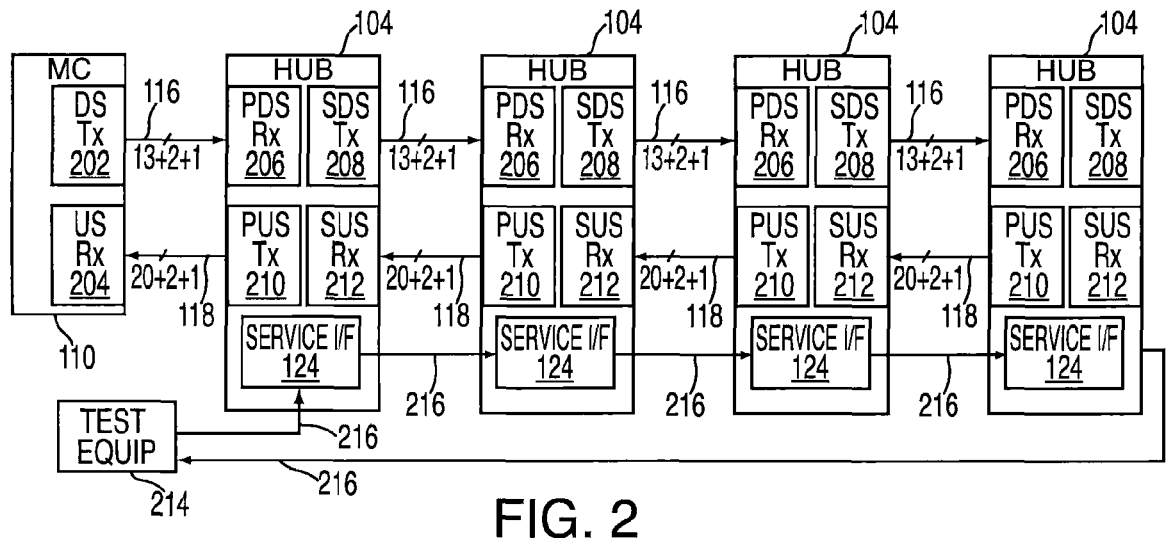
FIG. 2 depicts cascade interconnected memory hub devices via high-speed upstream and downstream buses and/or service interfaces that may be implemented by exemplary embodiments.

Although only a single memory channel 102 is depicted in detail in FIG. 1 connecting the memory controller 110 to a single memory device hub 104, systems produced with this configuration may include more than one discrete memory channel 102 from the memory controller 110, with each of the memory channels 102 operated singly (when a single channel is populated with modules), independently or in parallel (when two or more channels are populated with memory subsystems such as memory modules) to achieve the desired system functionality and/or performance. Moreover, any number of bitlanes can be included in the bus 114, wherein a bitlane includes one or more link segments between any two devices comprising a bitlane and wherein the bitlane can span multiple cascaded memory hub devices 104, as depicted in FIG. 2. For example, the downstream bus (comprised of link segments 116) can include 13 bit lanes, 2 spare lanes and a clock lane, while the upstream bus (comprised of link segments 118) may include 20 bit lanes, 2 spare lanes and a clock lane. To reduce susceptibility to noise and other coupling interference, low-voltage differential-ended signaling may be used for all bit lanes of the bus 114, including one or more differential forwarded clocks. Both the memory controller 110 and the memory hub device 104 contain numerous features designed to manage the redundant resources, which can be invoked in the event of intermittent and/or permanent hardware failures, coupling faults and/or other failure types. For example, multiple spare segments of the bus 114 can be used to replace one or more failed data or clock segments (e.g., hub-to-hub interconnection(s)) in the upstream and downstream directions—allowing the memory system to continue to operate with full fault detection capability when one or more faults exist in one or more of the interconnections between any two devices attached to the upstream and/or downstream cascade interconnect busses (e.g., as shown in the replaced segments highlighted in bold in FIG. 3 116 and 118).

In one embodiment, one or more segment(s) comprising one of the spare bitlanes can be used to replace one or more failing data and/or clock segment(s), while one or more segment(s) comprising a second spare bitlane is used to repair one or more data segment(s) but not a clock link. The existence of the spare bitlane(s), in conjunction with the ability to apply single segment(s) comprising a spare bitlane to replace one or more failing device-to-device interconnect(s) comprising the upstream and downstream buses maximizes the ability to survive multiple interconnect failures (such as intermittent and/or hard failures), while continuing to retain the initial communication bandwidth and/or communication fault tolerance. Additionally, when not used to replace defective segment(s) in the upstream and/or downstream bus(es), one or more of the spare lanes can be used to test for transient failures or be operated and monitored to determine bit error rates on the bus(es) e.g. by mirroring the signals on a known bit lane onto a spare bit lane and comparing the information at a receiving hub device and/or memory controller to determine if the received information is the same or different. In an exemplary embodiment, the spare lane(s) are tested and aligned during initialization but are deactivated during normal run-time operation (e.g., to reduce system power consumption). In a further exemplary embodiment the channel frame format, error detection capability and communication protocols are the same before and after the invocation of one or more spare bit segments. The link interface 125 can be used to manage bitlane selection and the flow of information on the bus 114.

In order to allow larger memory configurations than could be achieved with the pins available on a single memory controller 110, the memory channel structure and protocol implemented in the memory system 100 allows for the memory hub devices to be cascaded together. Memory hub device 104 contains buffer elements in the downstream and upstream directions to enable the re-driving of data at each hub device 104, thereby minimizing bus loading and maximizing the data rate on the high-speed memory channel 102 to and from the host processing system 112. In order to optimize bandwidth to and from the host 112, it is desirable to have greater bandwidth capabilities on the attached UDIMMs 108 and RDIMMs 109 (and/or other memory device interconnect means) than can be handled by the high-speed memory channel 102. This allows the memory controller 110 to efficiently schedule traffic on the high-speed memory channel 102 by selecting from a pool of resources. It also introduces the need for flow control of the data returning on the upstream links 118 to maximize the use of the available bus bandwidth(s). In an exemplary embodiment, this flow control is achieved by the proper selection and scheduling of commands transmitted on the downstream links 116 through downstream transmission logic (DS Tx) 202 of FIG. 2 with knowledge by the memory controller 110 of the capacity of the upstream links 118 at a given time. In an alternate exemplary embodiment, the flow control is distributed between the memory controller and the one or more hub devices—e.g. with data being returned to the controller with variable latency, wherein the hub device determines when the upstream links are available, including a tag or other identification means with the returned data to allow the memory controller to match the received information with the original command. Upstream data is received by upstream receive logic (US Rx) 204 as depicted in FIG. 2. The DS Tx 202 drives signals on the downstream link segments 116 to a primary downstream receiver (PDS Rx) 206 of memory hub device 104. In the exemplary embodiment, addresses, commands controls and data received at the PDS Rx 206 are processed locally at the targeted memory hub device 104 if they are addressed to that device and are also re-driven downstream via a secondary downstream transmitter (SDS Tx) 208 whether or not they are processed locally. The memory hub device 104 may analyze the commands being re-driven to determine the amount and timing of potential data that will be received on the upstream segments 118 for timing purposes in response to the commands. Similarly, to send responses upstream, the memory hub device 104 drives upstream communication via a primary upstream transmitter (PUS Tx) 210 which may originate locally or be re-driven from data received at a secondary upstream receiver (SUS Rx) 212. In an exemplary embodiment, the PDS Rx 206, SDS Tx 208, PUS Tx 210, and SUS Rx 212 are components of the link interface 125 of FIG. 1.

Exemplary memory hub devices 104 include support for the separate, out-of-band, service interface 124, as depicted in FIGS. 1 and 2, which can be used for such uses as initialization, status reporting, advanced diagnostic and testing purposes. For example, the service interface 124 can be used to configure memory interface parameters in physical interfaces (PHYs) of ports A 105 and B 106. As depicted in FIG. 2, the service interface 124 can be interconnected in a cascaded interconnection structure between multiple memory hub devices 104. This enables hardware such as test equipment, service processors, specialized bring-up hardware or other equipment 214 to send information such as commands, addresses, controls, etc. on service bus 216, which is passed between the service interfaces 124 in an exemplary embodiment. In one embodiment, the service bus 216 is connected in a cascaded loop such that the most distant service interface 124 in the cascade returns data or status to the test equipment 214. In an alternate embodiment, the service bus 216 is connected in a similar configuration as the downstream and upstream segments 116 and 118, such that communication propagates downstream between the service interfaces 124 and returned data or status flows in the opposite direction (e.g., upstream).

In an exemplary embodiment, each service interface 124 selectively operates in one or both of 'field replaceable unit service interface' (FSI) and joint test action group (JTAG) modes. The FSI mode may be used during run-time, providing higher data rates and redundant, 2 wire interfaces for increased reliability. The JTAG mode is well adapted to provide bring-up and manufacturing test support but may also be used at other times. The service bus 216 may include a configuration indicator to identify the mode of operation and allow remapping the signals comprising the service bus 216 for each mode. Remapping signals to enable operation of each mode reduces the total pin count required for the service bus 216 to allow the operation of each of the service interfaces supported by block 124.

Figure 3:
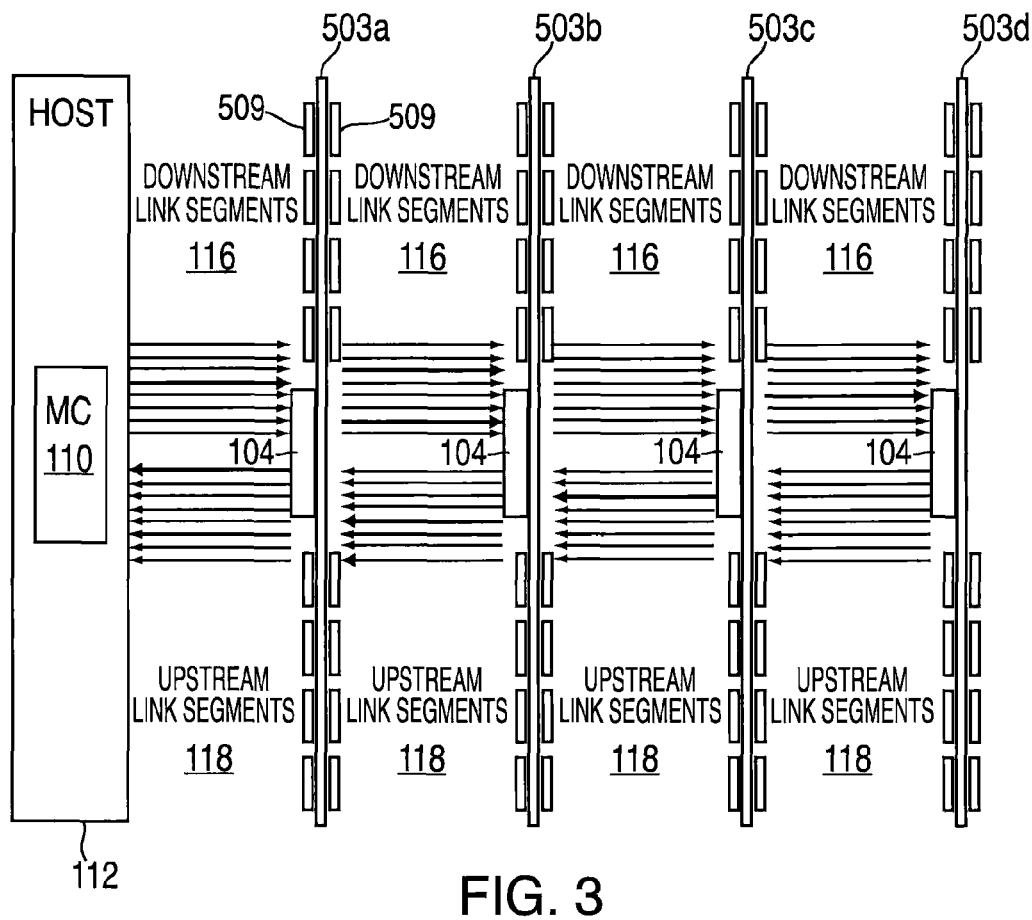
FIG. 3 depicts a cascade interconnected memory system that includes memory modules communicating via high-speed upstream and downstream buses comprised of multiple upstream and downstream segments that may be implemented by exemplary embodiments.

FIG. 3 depicts an exemplary embodiment where the memory hub devices 104 are integrated on DIMMs 503*a*, 503*b*, 503*c*, and 503*d*, communicating via cascade interconnected downstream link segments 116 and upstream link segments 118. In an exemplary embodiment, e.g. for testing purposes, communications can loop around at either or both ends of the cascade interconnect structure, for instance, between the downstream link segments 116 and upstream link segments 118 at or beyond the DIMM 503*d* and at the memory controller 110. Segments 116 and 118 shown in bold each represent single segments originally comprising all or a portion of one or more spare bit lanes that have been re-mapped, by the hub device(s) 104 and/or memory controller 110, to replace unique failing segments between devices included in the downstream and/or upstream buses, while retaining the same level of fault tolerance as that available in the system prior to the existence of a interconnect failure. The DIMMs 503*a*-503*d* can each include one or more memory devices 509, which may be DDR DRAM devices, as well as include other components known in the art, e.g., resistors, capacitors, other re-drive devices, non-volatile storage (e.g., SPD devices), voltage and/or thermal measurement devices, etc. The memory devices 509 are also referred to as DRAM 509 or DDRx 509, as any version of DDR (or other memory device technologies) may be included on the DIMMs 503*a*-503*d*, e.g., DDR2, DDR3, DDR4, SDR (single data rate), QDR (quad data rate), asynchronous memory devices, synchronous DQ memory devices, etc. It can also be seen in FIG. 3 that the DIMM 503a, as well as DIMMs 503b-d may be dual sided, having memory devices 509 on both sides of the modules. Memory controller 110 in host 112 interfaces with DIMM 503a, sending information such as commands, controls, address and data via the downstream link segments 116. DIMMs process commands intended for them and in the exemplary embodiment also forward the commands to the next DIMM in the daisy chain (e.g., DIMM 503a redrives to DIMM 503b, DIMM 503b redrives to DIMM 503c, etc.). Information sent on the upstream link segments 118 may be comprised of data, status information, error information and/or other information intended for the memory controller 110 and/or may include information intended for one or more upstream and/or downstream hub devices such as in exemplary MBIST test modes initiated by a downstream and/or upstream hub device in response to or independent of a request from the memory controller. In exemplary embodiments, the downstream 116 and/or upstream 118 link segments also include a forwarded clock which travels with the data and is used by the receiving device (e.g. hub 104 and/or memory controller 110) to capture the data traveling in conjunction with the forwarded clock.

Figure 4:
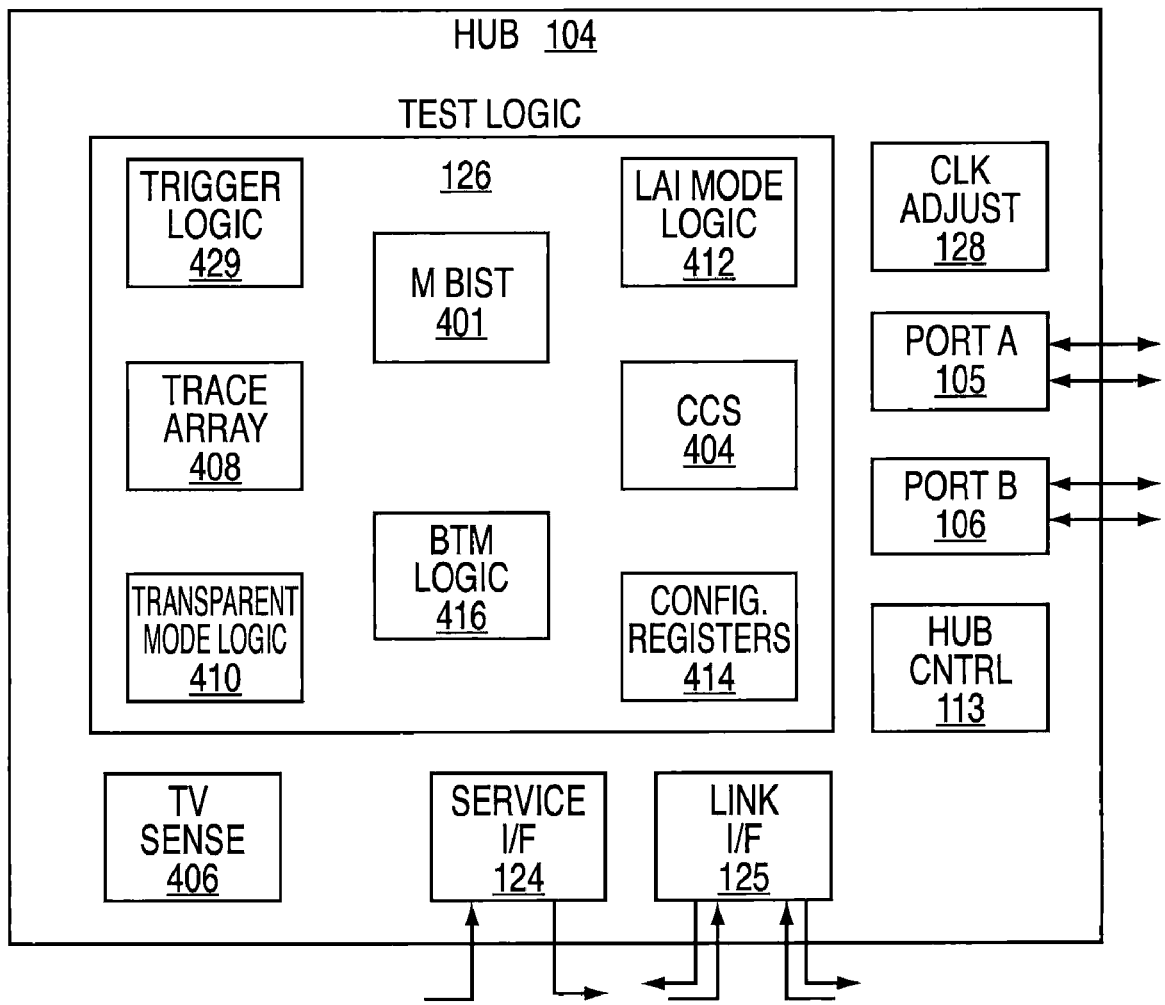
FIG. 4 is a diagram of memory hub device elements that may be implemented by exemplary embodiments.

FIG. 4 is a diagram of various elements of memory hub device 104 that may be implemented by exemplary embodiments. As previously described in reference to FIG. 1, memory hub device 104 includes various communication interfaces, such as port A 105, port B 106, service interface(s) 124, and link interface(s) 125, as well as clock adjust logic 128 to adjust clock timing relationships and/or frequencies between the various communication interfaces. Memory hub device 104 also includes control logic, such as hub control 113 and test logic 126. Test functions in the test logic 126 may be implemented using numerous logic and storage elements, such as an MBIST apparatus 401, CCS 404, trace array(s) 408, transparent mode logic 410, LAI mode logic 412, configuration registers 414, BTM logic 416, trigger logic 429, etc. One or more digital temperature and voltage sensor(s) 406 may also be included in the hub device 104 (and/or or external to the hub device 104) and may be readable through the service interface 124.

The MBIST apparatus 401 provides the capability to read and/or write different types of data patterns to specified memory locations locally attached to the hub device 104 and/or attached to one or more memory modules attached to the hub device and/or attached to hub devices located upstream and/or downstream to the MBIST apparatus 401, for the purpose of detecting faults that may exist in the memory system 100. The exemplary MBIST apparatus 401 receives information in response to read requests and detects these faults, reports failing locations and data bit positions, and assists in isolating failing memory devices, e.g., memory devices 509 of memory modules 108 and/or of RDIMMs 109, hub devices 104 and/or segments 116 and 118 located within the memory system 100. The CCS 404 enables users to assemble instructions (e.g., up to 16 instructions) using architected mainline or maintenance commands to create lab and/or system test floor debug routines external to the memory hub device 104 (e.g., by way of memory controller 110 or test equipment 214 of FIG. 2). The CCD 532 of FIG. 5 may re-utilize portions of the MBIST apparatus 401 to monitor the incoming commands and set fault indicators in the configuration registers 414 if command collision conditions are identified.

The trace array 408 supports trace modes to aid in problem debug and lab diagnostics—storing data in response to preprogrammed trigger events, such as events detected by trigger logic 429. The trace array 408 can capture high-speed bus 114 and/or memory device interface information (e.g., one or more of upstream and/or downstream packets, memory device address, command, control and/or data, etc.) for external evaluation. The trigger logic 429 may also provide an observation point for one or more internal signals of the memory hub device 104 and/or one or more signals of ports A 105 and B 106, including internal clocks.

The transparent mode logic 410 allows access to the memory devices 509 of FIG. 1 without operating the memory channel 102 at full frequency. In this mode, the high-speed signals on the bus 114 are converted into low speed signals and mapped to the memory device interface signals, e.g., to be compatible with devices attached to the ports A 105 and B 106, to enable use of existing test equipment and processes during development and test of the memory system 100. In an exemplary embodiment, both commands and data from the test equipment are sent at a double data rate with respect to the memory clock. The transparent mode logic 410 multiplies this slow speed bus clock frequency by 4 to create the normal internal logic and memory clock frequencies. The transparent mode interface signals are sampled by the transparent mode logic and driven to the memory devices during write operations using one or more hub ports (e.g. 106 and 105). Similarly, in an exemplary mode the test equipment sends the expected data to the hub device during read operations. The data returned to the hub device in response to the read command(s) sent to the memory device(s) after receipt of a read command from the test equipment is compared to the read data sent to the hub device, with any failure information returned to the test equipment for reporting and diagnosis. The re-mapping of signals from the high speed bus 114 to the memory device interface(s) can be assigned in a manner that is optimal for a given hub implementation, given that all necessary memory interface signals are sent to the memory devices with the correct clock-to-signal relationships for the given memory technology.

The LAI mode logic 412 enables observation of high-speed activity on bus 114 using an external data capture and viewing device such as a logic analyzer. In an exemplary embodiment, when LAI mode is active, the memory hub device 104 echoes the signals it samples and re-drives all or a portion of the signals from the controller interfaces onto the memory interface signals. The echoed signals are descrambled and may be repaired by lane sparing. In an exemplary embodiment, a 4:1 gear ratio may be established via the clock adjust logic 128 to de-serialize the memory channel signals resulting in slower transitions and capture requirements on the logic analyzer (e.g., allowing the use of lower cost and/or more readily available logic analyzers). Along with the upstream and downstream signals, the memory hub device 104 can output information from the clock adjustment logic 128 (e.g., to indicate the downstream block number currently being observed).

Figure 5:
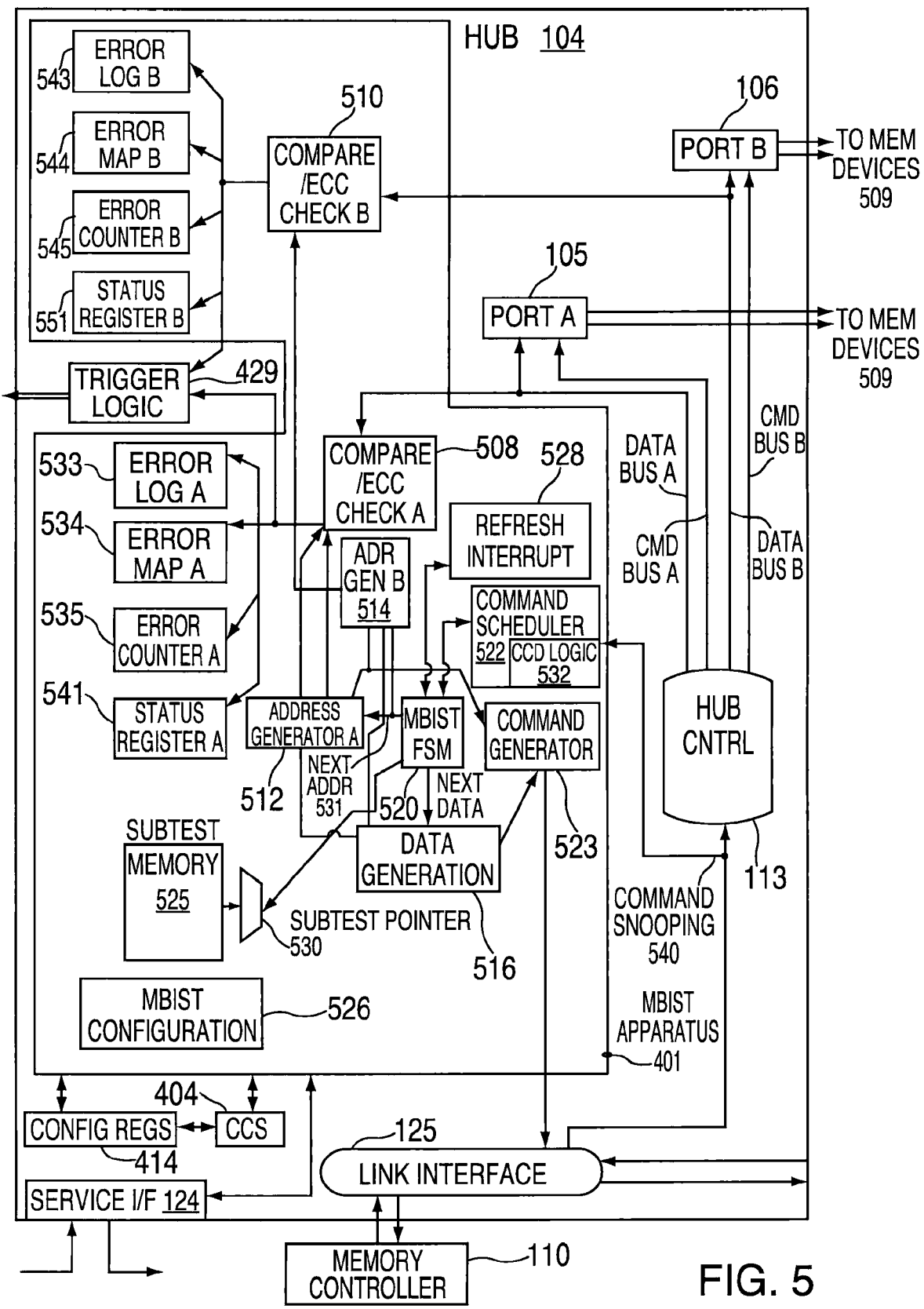
FIG. 5 is a diagram of the memory hub device including further detail of MBIST elements that may be implemented in exemplary embodiments.

FIG. 5 is a diagram of an embodiment of the memory hub device 104 including further detail of MBIST elements of the MBIST apparatus 401 of FIG. 4. In an exemplary embodiment, the MBIST apparatus 401 generates write and read commands through configured address ranges with configured data patterns to test the memory devices 509 (e.g., as depicted in FIG. 1) via ports A 105 and/or B 106 for fails detectable via check logic 508 and/or 510. Address generators 512 and 514 include the logic that creates the address ranges used during testing on ports A 105 and B 106 and can be programmed independently of each other. Likewise, a data generator 516 provides logic that creates the data patterns that will be written to ports A 105 and B 106. A configuration bit for each interface is also provided to enable the inversion of the data pattern(s) that are generated. The check logic 508 and 510 are used to compare expected data versus received data, or when in error correcting (ECC) data mode, checks for correct ECC from memory devices 509. In an exemplary embodiment the commands and data are multiplexed into the link interface 125 via a command encoder 523 and sent to the hub control 113. The commands and/or data are then sent to one or more hub devices located upstream and/or downstream from the hub device initiating the MBIST operation(s) via link interface 125, upstream link segments 118 and/or downstream link segments 116, wherein the hub device initiating the MBIST operation(s) operates as a master device for the duration of the MBIST operation(s).

The MBIST apparatus 401 also includes an MBIST finite state machine (FSM) 520 that provides logic for controlling the command sequencing, data/address incrementing, refresh interrupts, and subtest pointer increments. Further, the exemplary MBIST FSM 520 implements entry/exit logic for initiating and/or exiting self-timed refresh in memory devices which it is in communication with in an automated manner. Also, the MBIST FSM 520 includes a command generator that enables for the detection of many possible signal coupling faults and/or noise-generated faults. Command resource allocation logic is provided via a command scheduler 522 and is also included in the MBIST apparatus 401 for removing command overlaps and/or ensuring that such invalid command overlaps do not occur, as well as optimizing command spacing to memory to maximize useable bus and/or device bandwidths. This is described further herein. Additionally, the MBIST apparatus 401 contains a test memory 525 for storing subtests. In an exemplary embodiment, each subtest contains information about the subtest type, subcommand complement, address mode, data mode, and a "done" (e.g., "completion") bit. These elements allow for multiple passes through memory without a need to reload registers, as described further herein. The MBIST apparatus 401 further implements: Refresh interrupt logic 528, Stop on Error after subtest completed (configurable), Break after subtest completed (configurable), and communicates with trigger logic 429. These implementations are described further herein.

A single exemplary subtest refers to a full march through a configured address range. The MBIST apparatus 401 allows for multiple subtests during a single MBIST test of the memory array. Any number of subtests may be configured to run in a single MBIST test. The MBIST FSM 520 controls the sequencing of the MBIST subtests by incrementing subtest pointer 530 when a subtest is completed.

Some subtests support more than one memory read/write combination per address. Each command per address is called a subcommand. For example, during a read—write—write subtest, each address will receive a read, write, write command sequence before the MBIST FSM 520 increments the address. Each subcommand has an associated data pattern, and this pattern may be programmed to be complemented via the subtest memory 525. This allows for marches through memory that can detect signal and/or internal device coupling faults. In an exemplary embodiment, subtests that contain multiple subcommands are executed with a single Bank Activate command which is then followed by the appropriate Write or Read commands with the bank left open until the final subcommand is executed—at which time an auto-precharge is issued to the open bank. This embodiment may assist in decreasing test time, although subcommands may also each be followed by an auto-precharge, or implemented using some other combination of operations and precharge(s), based on the test objectives.

An added looping mechanism provided by the MBIST FSM 520 enables a user to program infinite subtest loops. This feature may be used for burn-in tests, the capture and diagnosis of intermittent failures and/or other debug tests.

A refresh only subtest may be used test the memory retention capabilities of the memory devices 509 under test. This subtest can continuously refresh memory at one or more defined refresh rate(s) until a Break After Subtest bit is written—at which time the testing completes. Other elements illustrated in FIG. 5 are described further herein.

Figure 6:
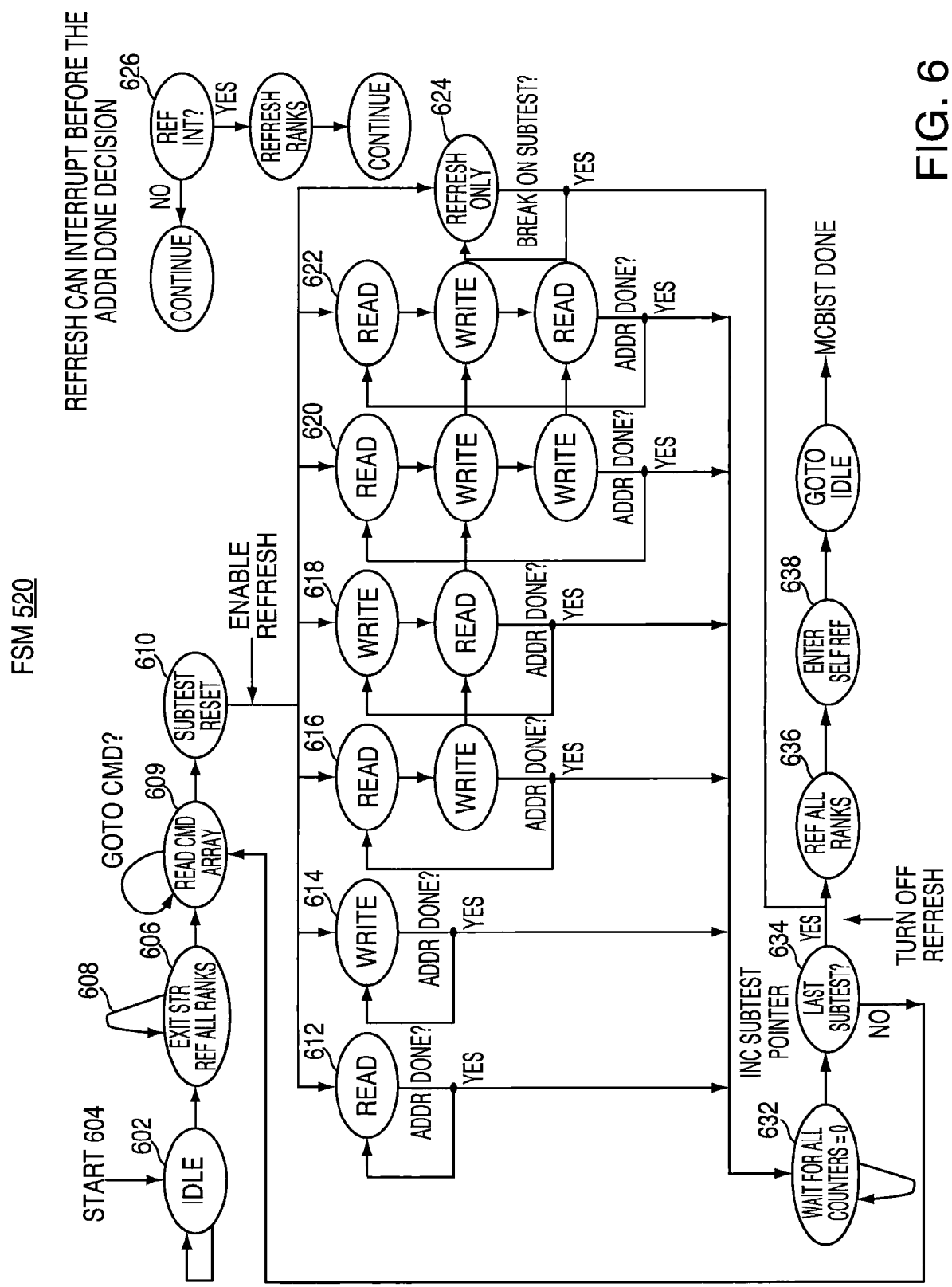
FIG. 6 is a diagram illustrating a finite state machine implementation of MBIST logic in exemplary embodiments.

Turning now to FIG. 6, a sample MBIST finite state machine implementation in accordance with exemplary embodiments will now be described. The MBIST apparatus 401 is initialized to a known state 602 (e.g., an "idle" state). When a start command 604 is issued, the MBIST FSM 120 checks to see if ports A 105 and/or B 106 are in self-timed refresh mode. If either or both are in self-timed refresh mode, then an exit self timed refresh command at state 606 is issued, and the FSM 520 waits an appropriate amount of time 608 before jumping to the next state (i.e., read the subtest memory 609).

If the ports A 105 and B 106 are not configured in self timed refresh mode, the FSM 520 automatically skips to the read the subtest memory state 609 to fetch the current subtest and then proceeds to the subtest reset state 610, the FSM 520 resets the address generators 512 and 514, and the data generator 516. The FSM 520 then jumps to one of the subtest type branches 612-624, depending on which subtest is being run. Branch 626 refers to the refresh interrupt state.

Upon exiting the branches 612-622, the address is incremented and checked to make sure it is not the last address of the current subtest. If the address is not the last address, then the next command is issued by going back to branches 612-622, depending upon the current subtest (if the subtest is Refresh Only 624, a Break on subtest bit is checked to see if testing should end). If the last address has been detected the FSM 520 waits for all current resource timers to timeout 632 and then checks for the last subtest 634. If the last subtest has been reached, FSM 520 exits testing by refreshing all the active ranks 636, and then issuing an enter self timed refresh command 638 to all the enabled ranks of both ports A 105 and B 106. If the last address has been detected, and the current subtest is not the last subtest, then the FSM 520 increments the subtest pointer 530 at state 634, and moves to the read subtest memory state 609 to get the next subtest type (e.g., one of subtest types 612-624), and begins the sequence all over again for the next subtest, until the last subtest is completed.

Subtest types enabled by the MBIST apparatus 401 are defined, but not limited to, the types described below and are used during run-time. The options in parentheses refer to dynamic variables. Configurations are static.

W(addr mode, data mode)—Write a background pattern to memory

R(addr mode, data mode)—Read a background pattern from memory

RW(addr mode, data mode)—Read a background pattern from memory, Write memory

WR(addr mode, data mode)—Write a background pattern to memory, Read memory

RWR (addr mode, data mode)—Read a background pattern from memory, Write Complement pattern, Read memory RWW (addr mode, data mode)—Read a background pattern from memory, Write memory, Write memory Random Command (addr mode, data mode)
Refresh Only—Refresh all enabled memory until Break on subtest bit is equal to a '1'

To use Random Command mode, in an exemplary embodiment, a data background with ECC is written to the memory under test in advance. The data mode is programmed to be random data with valid ECC. A linear feedback shift register (LFSR) may be used to create the random read/write commands, with a configurable weighting distribution. In an exemplary embodiment, each subcommand in a subtest will have the programmable setting of reading/writing the complement of the defined data phase.

In addition, another outer loop to an MBIST test may be specified where one or more hub and/or memory device settings and/or configurations are altered (e.g., based on MBIST configuration 526 of FIG. 5) after each pass through a full MBIST test run, thus allowing variations of one or more settings and/or configurations and re-test of the memory devices 509 via the ports A 105 and B 106. This "outer loop" test may be built into hardware or software. In an exemplary software implementation, a specific set of chip settings and/or configurations may be tested by changing the chip settings and/or configurations and then re-running the MBIST test. When the MBIST test finishes, the software checks to see if the current MBIST test, at a specific setting and/or configuration, passed or failed. A pass/fail plot may be drawn for each variable that is being changed during the outer loop test. An exemplary hardware implementation may include logic that does the similar operations within the MBIST configuration 526. The MBIST configuration 526 of FIG. 5 may represent a subset of or be derived from the configuration registers 414. The outer loop test provides a flexible and rapid means for determining the optimal settings and/or configurations of the logic and/or memory devices comprising both the memory subsystems within the memory system, as well as the memory system itself, to minimize faults during operation.

Figure 7:
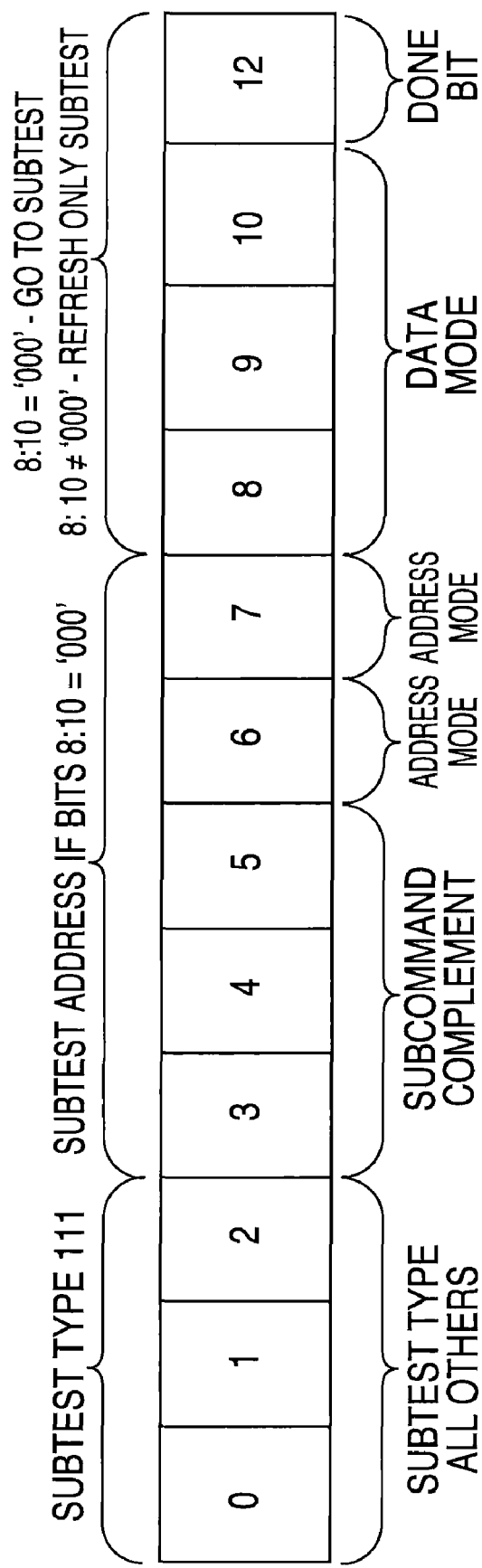
FIG. 7 illustrates a format of an entry in a memory array that is programmable by the MBIST logic in exemplary embodiments.

Turning now to FIG. 7, a format of an entry in a subtest memory array 525 that is programmable by the MBIST apparatus 401 will now be described in accordance with exemplary embodiments. The MBIST apparatus 401 may support multiple subtests to be run in succession. In accordance with one embodiment, each entry in the memory array 525 is programmed using the following subtest definition.

| Subtest Type—0:2b | |
|---|---|
| 000—Write | W |
| 001—Read | R |
| 010—Read/Write | RW |
| 011—Write/Read | WR |
| 100—Read/Write/Read | RWR |
| 101—Read/Write/Write | RWW |
| 110—Random Command Sequence | |
| 111—Goto Subtest N or Refresh Only Subtest | |

If Subtest(0:2)=111 and Subtest(8:10)=000, then this is a Goto command and Subtest Addr—3:7 specifies which subtest address to change to (used for looping). If Subtest(0:2) =111 and Subtest(8:10)/=000, then this is a Refresh Only command.

For all other decodes of Subtest Type(0:2), the following definitions may be used.

Subcommand Complement—3:5
   (3)—Complement the data for the first subcommand
   (4)—Complement the data for the second subcommand
   (5)—Complement the data for the third subcommand Address Mode—6
   0—Sequential
   1—Random
Address Mode—7
   0—Forward
   1—Reverse
Data Mode—8:10
   000—Fixed
   001—Random Forward
   011—Random w/ECC Forward
   101—Data equals Address
   110—Data Rotate Left
   111—Data Rotate Right
Done bit—12 (also referred to as a completion indicator)
   0—MBIST test will not finish after current subtest, continue on to next subtest
   1—MBIST test will complete after current subtest has been executed As indicated above in FIG. 5, the MBIST FSM 520 of the MBIST apparatus 401 includes entry/exit logic for handling automated self-timed refreshes. Entry/exit logic features may include: Start, Fail, In Progress, and Done information that can be read out of the memory hub device 104 during runtime.

The MBIST apparatus 401 may automatically take the memory devices 509 out of STR state, if currently in that state. Break after subtest is supported and the MBIST apparatus 401 may be interrupted while it is in loop mode—with the MBIST apparatus 401 exiting the subtest after the current subtest has completed. Break after subtest is also used to stop a Refresh Only subtest. The MBIST apparatus 401 my also support Stop on Error after subtest completed. If a corresponding bit is set before issuing the command to initiate the MBIST testing, then when an error is detected, the MBIST FSM 520 exits the subtest after the current subtest is completed.

Refreshes may be generated every refresh interval (reflnt) via a configurable interrupt timer component of the refresh interrupt logic 528. Refreshes to separate ranks accessed via either port A 105 or port B 106 may also be enabled and disabled via a configuration register (e.g., MBIST configuration 526). In an exemplary embodiment, refreshes are sent out only after the completion of all commands to a particular address, and the rank is then reserved for a time of tRFC before new read and write commands are sent to the particular rank.

In an exemplary embodiment, refresh features may include the following:
   Interrupt-driven refresh with a programmable cycle count from 0 to 15.0 us
   Immediate refresh to all ranks upon startup of the MBIST engine
   Staggered rank refresh—e.g., as applied to a module having 8 ranks of memory devices (but not limited to 8 ranks), where identical ranks are accessed via ports A 105 and B 106 and refreshed at the same time, (if enabled):
   Rank0 refreshed after 0.25*reflnt, then refreshed at reflnt thereafter
   Rank1 refreshed after 0.5*reflnt, then refreshed at reflnt thereafter
   Rank2 refreshed after 0.75*reflnt, then refreshed at reflnt thereafter
   Rank3 refreshed after 1.0*reflnt, then refreshed at reflnt thereafter
   Rank4 refreshed after 0.125*reflnt, then refreshed at reflnt thereafter Rank5 refreshed after 0.375*reflnt, then refreshed at reflnt thereafter Rank6 refreshed after 0.625*reflnt, then refreshed at reflnt thereafter Rank7 refreshed after 0.875*reflnt, then refreshed at reflnt thereafter Final refresh of all ranks is performed upon exit As can be observed above, the exemplary 8 rank module would have each rank refreshed at different times, resulting in reduced power consumption, reduced noise, etc—although other refreshing offsets could also be applied and/or multiple ranks could be refreshed simultaneously to further stress the memory module/subsystem and/or to reduce the total refresh time.

As indicated above, the MBIST apparatus 401 provides resource scheduling. Dynamic command scheduling controls the command spacing —e.g., due to changing memory address locations during testing. The command scheduler 522 ensures that the command will not violate timing parameters of memory devices and/or modules attached to ports A 105 and B 106. If a command cannot be issued in the current cycle due to a busy resource on either or both of ports A 105 or B 106, then the command may be held until the next cycle and a logical determination made to see if the command can be issued at that time. A minimum command gap parameter may also be programmed, such that all commands are spaced greater than the specified minimum gap. This may be useful for debug as well as for throttling the command generator of the FSM 520 to slow command generation rates (e.g., increase command spacings). To achieve the highest command generation rate (e.g., the smallest valid command spacings), the addressing may be set such that the address does not access the same bank when the address is incremented. Configuration bits have been included to enable memory command spacing circuitry to wait a programmed fixed number of cycles between bank activate commands or to randomly wait (based on a programmable seed) from 1-1023 cycles, with configuration bits supplied to weigh the wait time from 1-1023 cycles, 1-511cycles, 1-255 cycles or 1-127 cycles. Two random variables can be used when the command spacing is not fixed. The first random variable generates wait cycles from 1-128 cycles. The second random variable is used to multiply the generated wait cycles by 1 to 8. A value of 1 may be subtracted from the final result. This double random command spacing may be very useful in stressing system power delivery.

Dynamic resource scheduling of the MBIST apparatus 401 provides an accurate model of the stresses memory controller 110 may put on accesses to the memory devices 509. Timing between commands is subject to memory timing parameters and resource allocation constraints. In an exemplary embodiment, commands may not be reordered with respect to when the bank activate command is sent out to the memory devices 509 via ports A 105 and B 106. In addition, data may not be reordered. If a command occurs, the next command in the stream does not utilize the data bus until the previous command releases the data bus. Configuration bits are provided and sampled by the address generators 512 and 514 to determine how many memory ranks are configured on each port (e.g., how many device ranks, UDIMM ranks 108 and/or RDIMM ranks 109). In an exemplary embodiment, the subtest memory 525 can be loaded with up to 32 subtests that are to be executed, although other embodiments may include more or less subtests. Operations shown as RW, WR, RWR and RWW are two or more subcommands (operations) completed to a common row in a bank of memory —in this case there is no memory device precharge completed between the specified reads (R) or writes (W). The row or page is kept open and commands (e.g., reads and writes) are executed as fast as the timing parameters for the memory devices 509 allow. As previously described, configuration bits are also supplied to throttle back the speed at which commands are issued, if a larger command-to-command spacing is desired. Testing starts when the FSM 520 senses that the start MBIST bit has been activated. In an exemplary embodiment, the logic senses the configuration, density and/or type of memory devices and/or modules attached to the ports A 105 and B 106 and issues appropriate commands (if required) to exit from self-timed refresh. In an exemplary embodiment, all populated ranks of the memory devices 509 are refreshed in a staggered pattern with corresponding ranks of memory attached to ports A 105 and B 106 refreshed at the same time. FSM 520 reads the first subtest from the subtest memory 525 and signals the address generators 512 and 514 to start generating addresses, next address 531 of FIG. 5 may be pulsed each time the next address is scheduled for testing. The address generators 512 and 514 may have many programmable features that can be independently specified on a per port A 105 / B 106 and rank and/or socket basis that can ultimately cause the addresses to either be the same as each other or completely different from each other. The command scheduler 522 of FIG. 5 interrogates the addresses provided by the address generators 512 and 514 and determines and/or resolves all conflicts and/or collisions as well as determines when precharging has been completed. The FSM 520 signals that the requested resource (e.g., a row in a bank of memory devices 509) is available and to send the command out to both ports A 105 and B 106 (e.g. when both are configured and being operated simultaneously). The next address is pipelined and interrogated well before the current command is actually sent, so that the next command is ready once a current command is executed and the resources are available.

Commands may be sent out on the ports A 105 and B 106 by the command generator 523, starting with a bank activate row address strobe (RAS) command with it's subsequent column address strobe (CAS) command placed in a queue with a wait value this is calculated based on additive latency (AL) and active to internal read or write delay time (tRCD). When the wait value decrements to zero, the CAS command is issued if no other possible bus collisions are detected and no other timing parameters can be violated. Since the CAS commands can have several cycles of wait time, additional RAS commands for other addresses can be sent out before any given CAS command is issued on ports A 105 and B 106. The hardware further checks to make sure RAS commands aren't violating timings such as active-to-active command period for a 1 KB page (tRRD) and four bank activate window (tFAW). The command scheduler 522 may ensure that the CAS commands do not violate other timing parameters or basic data bus collisions. When modules are configured on ports A 105 and B 106, the command scheduler 522 can determine the extreme allowable command spacings and timing parameters to ensure that they are not intentionally violated. An example of this is an addressing mismatch between memory attached to ports A 105 and B 106, where different device densities and/or ranks are accessed on each port —which can result in the need to wait multiple cycles between commands issued on the ports to prevent command collisions and/or timing violations. An auto precharge may be issued with the last associated CAS command of a previous RAS command (bank activate). This may be done to allow for situations were the various memory devices 509 do not have the same number of column address bits.

By way of illustration, the following resources may be managed by the MBIST apparatus 401. The number and type of resources may change depending upon the application and memory interface topology. It will be understood by those skilled in the art that any number and type of resources may be utilized. The following listing is for illustrative purposes and is not to be construed as limiting in scope: ranks, banks, data bus, command busses, data bus turnaround resources, four bank activate window (tFAW) resources, and minimum command gap resources.

Resource scheduling of resources (e.g., rank, bank, data bus, etc.) will now be described. To schedule a resource, the exemplary command scheduler 522 of FIG. 5 uses counters and shift registers. When a new command is ready to be issued, the command scheduler 522 checks to see if the resources for that current command are free. The resources to be used depend upon the command type (e.g., read, write, refresh) and the address. To determine if a command can be issued to the memory device(s) and/or module(s), all the resources that are necessary for the current command must be free. Each resource has special requirements for determining if they are free, for example, banks of the memory devices 509. In an exemplary embodiment, resource allocation may support 128 memory device banks (e.g., 0-63 for port A 105 and 64-127 for port B 106). Each bank may have a 6 bit counter that is loaded with a tRAS minimum value when a bank activate condition occurs. The counter decrements until another command is issued to that bank, at which time the counter contents are changed to include timings that reflect such memory device timings as tRAS (activate to precharge command period), tRP (precharge command period), tRTP (internal read command to precharge command delay) and tWR (write recovery time). The counter may also consider if read or write operations are performing an auto-precharge, if the bank is being left open, etc. When a precharge signal for the bank is detected, the counter decrements to zero before the bank is available again (after the contents are adjusted).

During normal operation of the memory hub device 104, the command scheduler 522 may be put in a mode to snoop an incoming command stream 540 of FIG. 5 and schedule the commands into the resource scheduler of the FSM 520. The resource scheduler detects if commands from the memory controller 110 are sent with non-legal timings (e.g., the received commands will result in a timing and/or resource violation). In this mode, referred to as command collision detection (CCD) mode, an exemplary implementation of CCD logic 532 within command scheduler 522 raises an error condition if there is an illegal use of any resource (e.g., rank, bank, data bus, etc). The CCD logic 532 can operate independently for ports A 105 and B 106. CCD mode can aid in the debug and diagnosis of faults occurring during bring-up and/or design validation. When CCD mode is enabled, traffic is snooped on both ports A 105 and B 106 simultaneously, and if a collision or timing parameter error is detected a Machine Check or Retry event can be triggered. In an exemplary embodiment, protocol checks are monitored on both ports A 105 and B 106 and may include the following:

1. Receipt of a refresh command and the specified rank is not idle.
2. Receipt of a bank activate command and the bank is already open or is being precharged.
3. Receipt of a read or write command and the bank isn't open.
4. Receipt of a precharge only command and the precharge command is too early (tRAS min or tRTP violation will occur. In the exemplary embodiment, the CCD logic 532 will only check for this condition for standalone precharge commands—not for auto precharge read or write commands).
5. A tRRD violation (timing between bank activations to different banks).
6. tRCD violation (timing between an activation command and a read or write command).
7. tCCD (CAS to CAS command delay) violation. E.g. for DDR3 devices, this is 4 clocks even when BC (burst chop) =4.
8. A tFAW (four activate window) violation.
9. A write-to-write minimum gap violation (pertinent if $2^{nd}$ write is to other rank otherwise tCCD is violated).
10. A read-to-read minimum gap violation (pertinent if $2^{nd}$ read is to other rank otherwise tCCD is violated).
11. A write-to-read minimum gap violation (WL +(2 or 4 tCK) +tWTR). This formula is only valid if the read is to the same rank, otherwise WL +(2 or 4 tCK) −RL.
12. A read to write minimum gap violation (RL +(tCCD/(1 or 2)) +2tCK −WL).

In an exemplary embodiment, the MBIST apparatus 401 internally generates commands in the same format as commands that are sent to the memory hub device 104 from the memory controller 110 via the link interface 125. Commands supported by the MBIST apparatus 401 may include but are not limited to: Bank activate with column read, Bank activate with column write, Write to Buffer, Refresh, Self Refresh, and Idle.

In an exemplary embodiment, there are four addressing modes supported by the MBIST apparatus 401: Sequential forward and reverse addressing and random forward and reverse addressing. For sequential and random addressing modes, a starting and ending address may be configured. In one MBIST test run, one or both of random address and sequential address tests may be performed. During reverse address sequences, the address generator starts from the end address and decrements to the start address, at which time the current subtest ends, and the MBIST apparatus 401 jumps to the next subtest. For random addressing, the user may define a fixed address width and select a configurable LFSR mask such that random patterns can be generated for different sized address ranges. Addressing may begin from an address other than the first or last address within a range.

Figure 9:
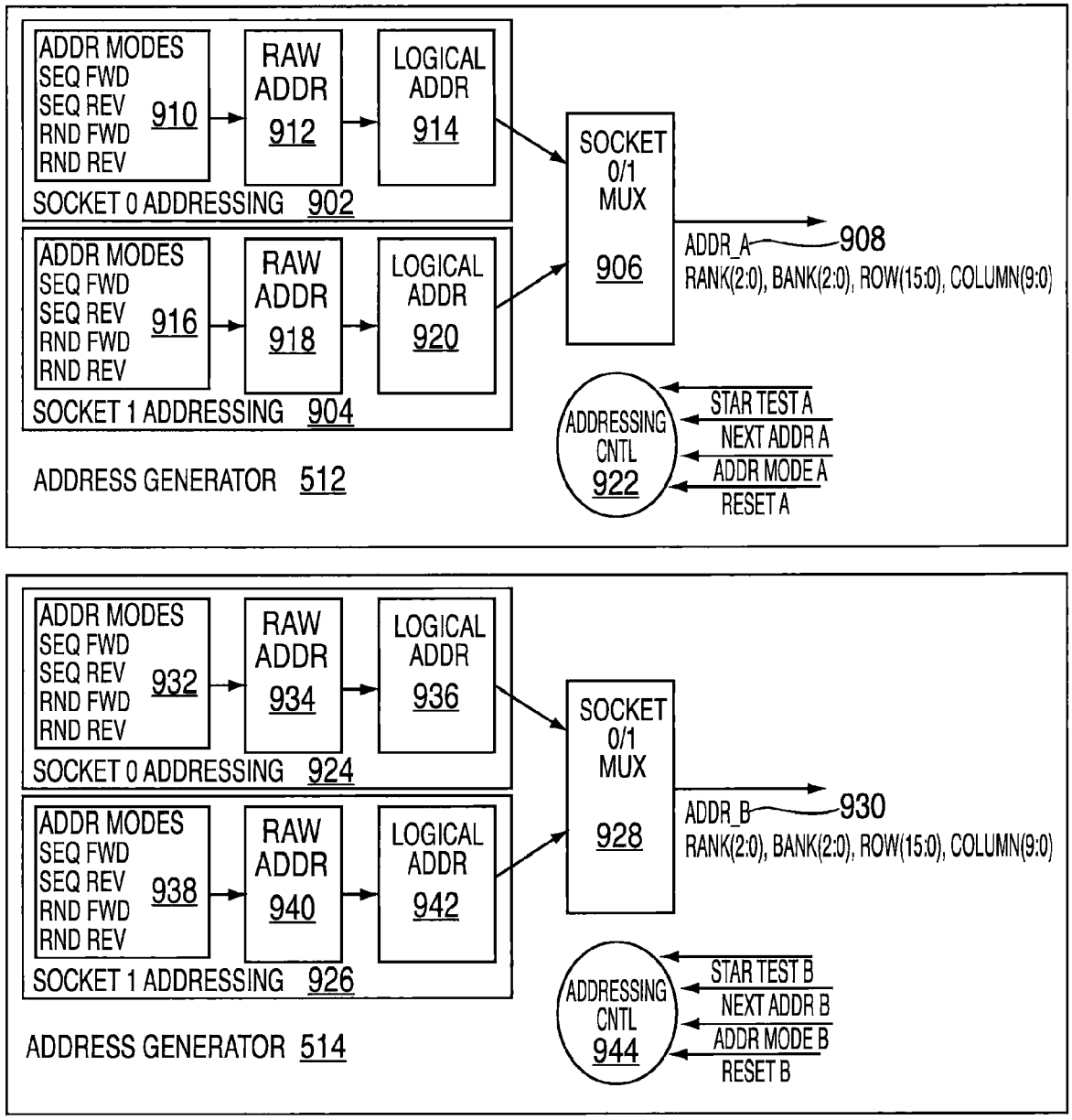
FIG. 9 illustrates an example of address generation on a socket basis in exemplary embodiments.

The MBIST apparatus 401 also includes support for varying memory device addressing (e.g., different device densities), on a per-port basis. This addressing support may include: two (or more) independent address generators (e.g., one or more per port), further extendable to permit the addressing for different density modules installed in multiple sockets (e.g., as depicted in FIG. 9) connected to ports A 105 and B 106; and sequential forward, sequential reverse, random forward, random reverse addressing modes for each address generator. Additionally, each address range may have its own LFSR and a configurable per bit mapping to specify which physical address maps to each Rank, Bank, RAS, and CAS—allowing for quick rank-to-rank and bank-to-bank accesses to memory.

Further, in order to support alternating between different sized modules, such as memory modules 108 and/or memory modules 109 of FIG. 1, a weighted random number or deterministic sequence can be specified to interleave between modules. If the end address for one module is reached before the end address is reached for the other module, the subsequent commands may be issued to the module that has not been fully addressed, until the end address is reached. In the exemplary embodiment, address information includes: the selection of the physical address bus, the memory rank selection, the memory bank selection, the row address and the column addresses.

Support for multiple memory device densities (e.g., multiple device generation(s)) may further include (e.g., on a per port A 105/B 106 basis):

Column bits 0-1, 0-2 are programmable, but are fixed in an exemplary DDR3 memory embodiment for a given test when burst length (BL)=4 or 8 respectively. Column bit 12 may also be programmable to select the burst length when the memory devices 509 are DDR3 and BL is set to "On The Fly". Column bit 12 can also be programmed for random selection based on a LFSR that is seeded at run time based on MBIST configuration 526. This may cause accesses to ports A 105 and B 106 to change in an intermittent fashion from BL=8 to BL=4 and visa versa. The exemplary addressing generator circuitry further supports:

Sequential addressing with a starting address and ending address.

Random addressing with a starting address and ending address. This creates a random address pattern of specified width starting from LSB to the specified width. Specified width +1 to MSB can be configured to any value.

Address 0 may be generated at the end of a subtest for the randomly generated address portion.

Figure 8:
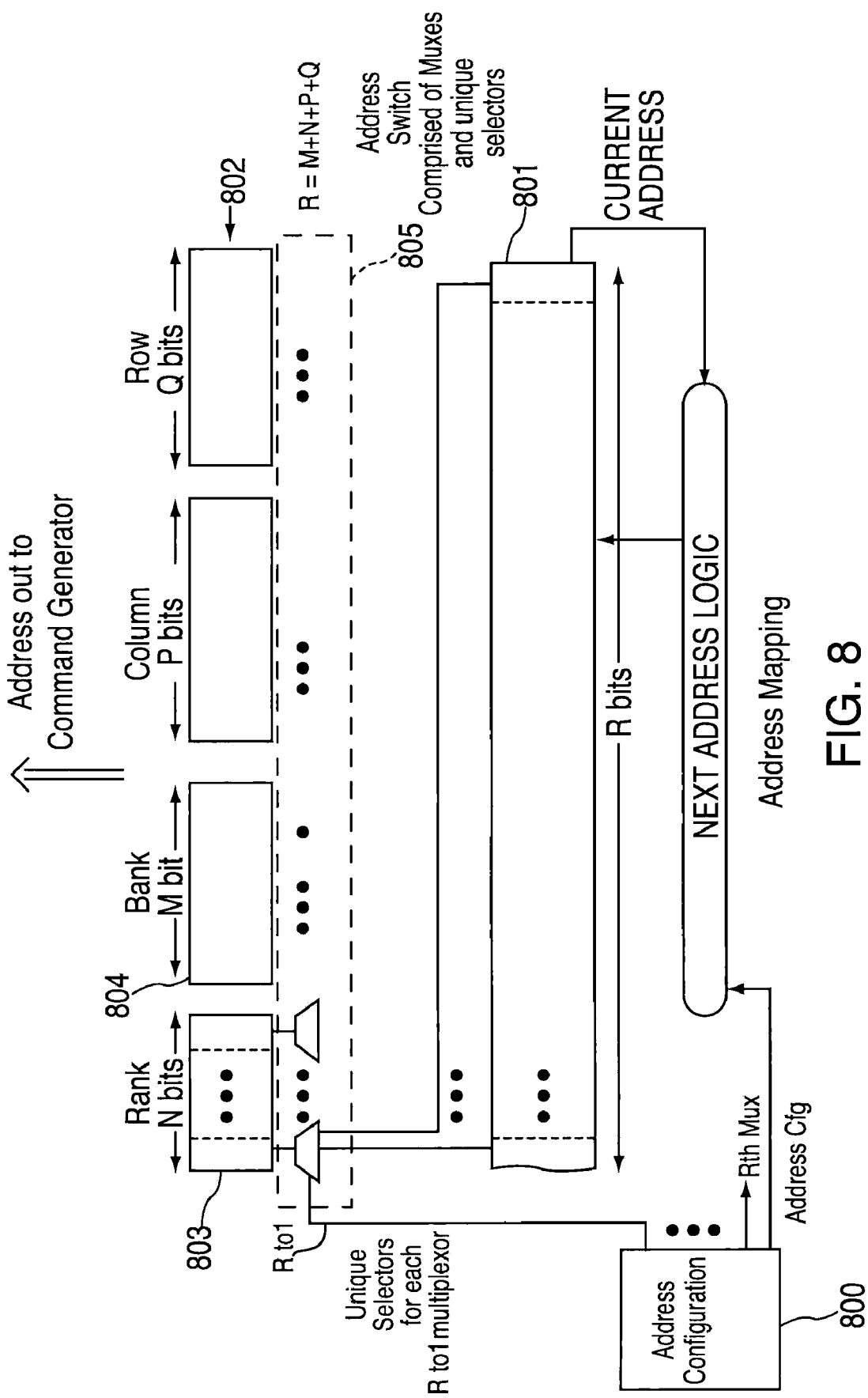
FIG. 8 is a diagram illustrating logic used for mapping addresses from a raw address to a logical address in exemplary embodiments.

Turning now to FIG. 8, logic used in mapping addresses from a raw address to a logical address in an exemplary embodiment will now be described. A raw address register 801 is mapped to a logical address register 802 through an address switch 805 (e.g., comprised of multiplexers and unique selectors) based on the outputs of configuration registers 800, which are set-up prior to the test. The resulting address is sent to the command generator to be issued to the memory devices (e.g., attached via ports A 105 and B 106). In random addressing mode, a fixed width setting LFSR mask and starting and ending address values must be initially configured via configuration registers 800. In an exemplary embodiment, active rank and bank bits, 803 and 804 respectively, can be set as the least significant bits (LSBs) to permit commands to be issued as quickly as possible to the ports A 105 and B 106 as previously described.

FIG. 9 illustrates an example of address generation on a socket basis in an exemplary embodiment. For example, the address generators 512 and 514 of FIG. 5 may include socket addressing logic to control multiple memory modules 108 and/or 109 of FIG. 1 via port A 105 and port B 106. In the example depicted in FIG. 9, the output of socket 0 addressing circuitry 902 or socket 1 addressing circuitry 904 is selected via mux 906 to drive an address value 908. The address value 908 can be output to port A 105. Based on address modes 910, a raw address 912 is determined and converted into a logical address 914 in socket 0 addressing circuitry 902. Similarly, based on address modes 916, a raw address 918 is determined and converted into a logical address 920 in socket 1 addressing circuitry 904. Addressing control 922 may determine values of the address modes 910 and 916 in response to various test, increment, mode, and reset inputs. Address generator 514 functions in a like fashion. An output of socket 0 addressing 924 circuitry or socket 1 addressing 926 circuitry is selected via mux 928 to drive an address value 930. The address value 930 can be output to port B 106. Based on address modes 932, a raw address 934 is determined and converted into a logical address 936 in socket 0 addressing circuitry 924. Similarly, based on address modes 938, a raw address 940 is determined and converted into a logical address 942 in socket 1 addressing circuitry 926. Addressing control 944 may determine values of the address modes 932 and 938 in response to various test, increment, mode, and reset inputs.

Address values 908 and 930 may be comprised of bit fields identifying the memory rank, bank, row, and column address (es) that are remapped as part of the MBIST testing. For example, rank address bits may serve as chip selects to the memory devices 509 via ports A 105 and B 106. Column bits 9:0 of address values 908 and 930 may map to column address bits 13, 11 and 9:2 for the memory devices 509, with column address bits 12 and 2:0 controlled differently, as previously described. Column address bit 10 may be an auto-precharge bit that FSM 520 controls to precharge a bank of memory.

Data mode features that are supported by the MBIST apparatus 401 of FIG. 4 may include the following:

Burst 8 or Burst 4 Fixed Data Pattern or On The Fly Burst 4/8 for DDR3

Random Data (one LFSR per bit)

Data=Address—Address is replicated on the data bus (e.g., multiple times, to cover the full data bus width). The last bits can be used as a burst counter. A configuration bit is provided to select the address for ports A 105 and B 106, and may switch over to exclusive testing on the opposite port if the last address is tested on a port having a smaller address range than the other port (e.g., due to lower density memory attached to one of the two ports).

Random Data and Address with ECC—this data mode feature may allow for random data and address, with valid check bits also generated and stored. This mode is useful for random command sequence mode; however, any command sequence mode may be used with this data mode as the data being read back is validated using the ECC check bits that were stored during the write operation.

Data Rotate Mode—a pattern is programmed into a register—during each burst, the data pattern is rotated right or left by a configurable number of bits.

As indicated above, the MBIST apparatus 401 also provides for error reporting features. When a failure is detected via checking logic 508 and 510, the exemplary MBIST apparatus 401 includes three mechanisms that may be used to record the failure: detailed error logs 533 and 543, error maps 534 and 544, and byte lane error counters 535 and 545. A register array may also be used to store the data when an error occurs. When an error occurs, the following information is stored in the exemplary error logs 533 and 543:

Received Data
Expected Data
Test Address
Subtest Number
Read Command Number
Burst Number
First N/last N fails (design/register array size dependent)

The error maps 534 and 544 refer to an array used in determining which memory devices 509 and/or modules failed during an MBIST test. Byte lane error counters 535 and 545 can count the number of fails that occurred on a byte lane. A user may reset the error logs 533 and 543, error counters 535 and 545, error maps 534 and 544 and status registers 541 and 551 after the full MBIST test is completed, e.g., by writing a configuration bit.

Features of status register 541 and 551 may include: CE (correctable error) Detected (ECC mode only); UE (uncorrectable error) Detected (ECC mode only); Error Trap Overflow; and Current Subtest Pointer. In accordance with an exemplary embodiment, the MBIST apparatus 401 completes even if a fail is detected, unless a stop on error configuration bit is set. If a fail occurs during MBIST operation, the trigger on fail logic 429 may be programmed to send an output pulse off chip for detection by external test equipment. This function enables test equipment, such as network analyzers and/or oscilloscopes, to capture fail data (e.g., due to memory device fails and/or interconnect signals) to facilitate the debug and root cause analysis of these fails.

Returning to FIG. 5, the CCS logic 404 may use portions of the MBIST apparatus 401 to perform command sequencing. For example, address generators A 512 and B 514 can be used for address generation and subtest memory 525 can be loaded with architected commands, where architected commands may be memory access operations, such as read and write commands. Passing the architected commands to the hub control 113 can make the commands appear as if they originated from another device, such as the memory controller 110. The CCS logic 404 may also drive the architected commands to the link interface 125, e.g., via the command generator 523, to be sent downstream or upstream to other memory hub device(s) 104. On a read command, a memory hub device 104 returning results can include a data pattern to identify the returned data. The fail logic 508 and 510 may be used to verify results from remote memory hub devices 104. The exemplary CCS logic 404 can also operate in array transmit mode that allows transmission of specific data patterns (e.g., 128 bit patterns) for each lane (including spare lanes) for the upstream and/or downstream directions from the link interface 125. The CCS 404 may operate in a single pass or loop, trapping on an error condition.

Returning to FIG. 4, transparent mode logic 410, as previously described, implements a design-for-test feature that allows access to the memory devices 509 behind the memory hub device 104 without the operating the bus 114 at full frequency. In this mode, high speed memory channel signals are converted into low speed signals and mapped to the interface signals for the memory devices 509 via ports A 105 and B 106. This enables use of existing test equipment and processes during initial debug, manufacturing test and/or design verification. Both commands and data from the test equipment can be sent at a double data rate with respect to a primary downstream clock on the bus 114. The clock adjustment logic 128 may multiply this slow speed bus clock frequency by 4 to create normal internal and memory clock frequencies. The memory hub device 104 can sample transparent mode interface signals, delaying the signals per configuration settings in the transparent mode logic 410 and/or configuration registers 414, and drive the modified signals to the memory devices 509 via ports A 105 and/or B 106. During write operations, both even and odd transfers of a single byte of transparent mode interface data may be sampled by the memory hub device 104 and be serialized to double data rate before being delayed and driven on data byte lanes to the memory devices 509. Similarly, the test equipment can drive expected data to the memory hub device 104 during read operations. Data from the memory devices 509 may be sampled at the memory hub device 104 and compared to expected data. The memory hub device 104 can drive failure information for each nibble lane back to the test equipment. The memory hub device 104 can also drive a byte lane of read data from each of the ports A 105 and B 106, as selected by configuration, to test equipment via the bus 114. Thus, the transparent mode logic 410 can make it appear that test equipment is directly accessing the memory devices 509 on bus 114, even though the memory hub device 104 is interposed between test equipment on bus 114 and the memory devices 509.

FIG. 10 illustrates an example of configuration registers to support test and bring-up of the memory system 100 of FIG. 1. The example of configuration registers 414 depicted in FIG. 10 represents a subset of the types of registers within the memory hub device 104 available for fault and diagnostic information. Register types may include error registers 1000, maintenance command registers 1002, mask registers 1004, status registers 1006, memory device registers 1008, and mode registers 1010. The error registers 1000 can include error tracking at various levels. For example, the error registers 1000 may track errors with respect to specific ranks of memory (e.g., RNKFIRO 1012 and RNKFIR1 1014), general errors (e.g., CSMFIR 1016), and general chip errors (e.g., FIR 1018, FIR1 1020 and FIR2 1022). The maintenance command registers 1002 can be used to kickoff maintenance commands or poll to see if the commands have completed. Mask registers 1004 may be used in combination with other registers to filter patterns or block triggering events. The status registers 1006 may provide non-error condition status information. The memory device registers 1008 can map to memory device(s) 509, providing buffered accesses, e.g., performing functions of register 502 for accesses to unbuffered memory modules 108. The mode registers 1010 can be used to change the behavior of the memory hub device 104, including support for the multiple test modes described herein.

Figure 11:
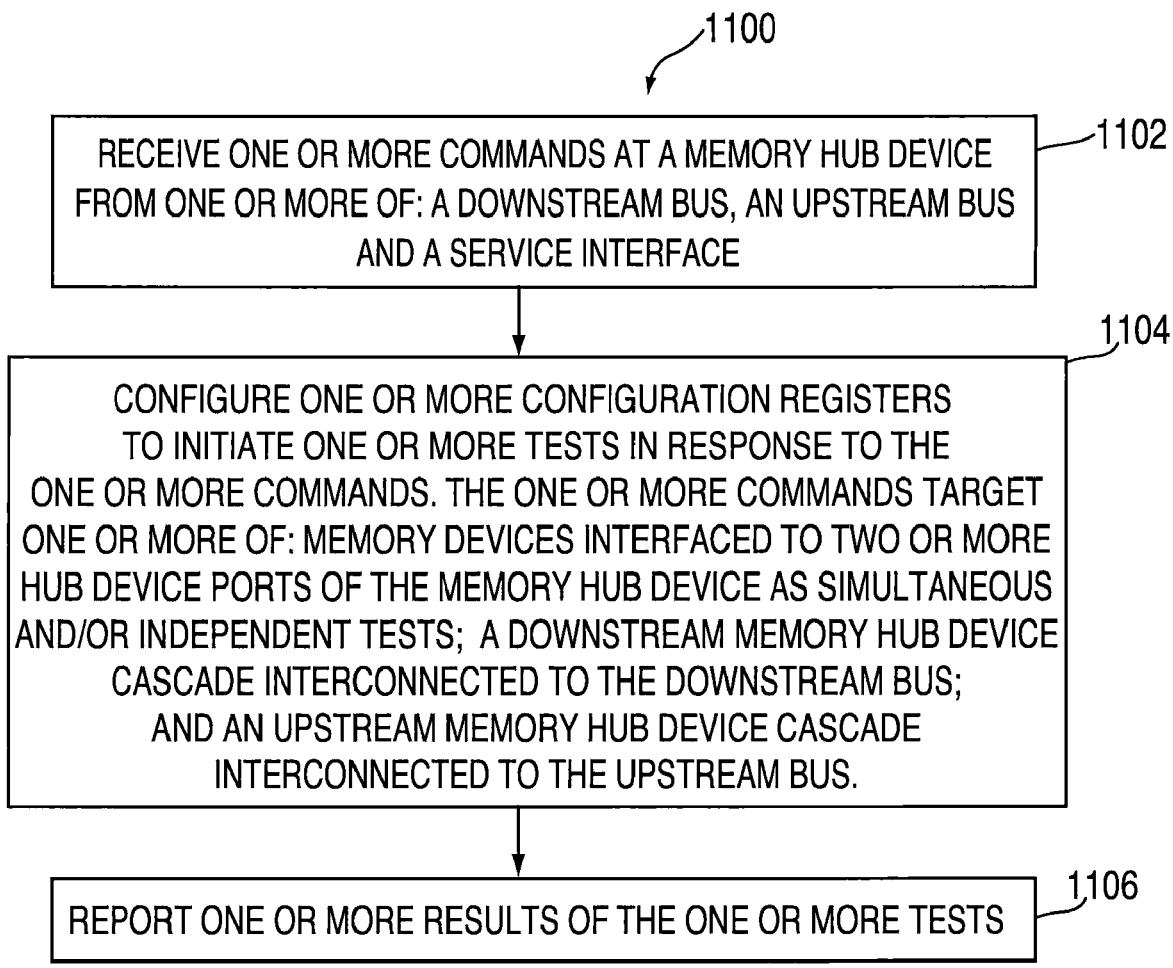
FIG. 11 depicts an exemplary process for test and bring-up of an enhanced cascade interconnect memory system that may be implemented by exemplary embodiments.

FIG. 11 depicts an exemplary process 1100 for test and bring-up of an enhanced cascade interconnect memory system. For example, the process 1100 may be implemented in a memory hub device, such as the memory hub device 104 described in reference to FIGS. 1-5. At block 1102, the memory hub device 104 receives one or more commands from one or more of: a downstream bus (e.g., including downstream link segments 116), an upstream bus (e.g., including upstream link segments 118), and service interface 124. Commands on the service interface 124 can be in JTAG or FSI mode format, while commands on the upstream or downstream buses can be packetized over multiple high-speed transfers (e.g., four transfers to construct a full set of one or more commands).

At block 1104, the memory hub device 104 configures one or more configuration registers (e.g., configuration registers 414) to initiate one or more tests in response to the one or more commands. The one or more commands can target memory devices 509 interfaced to two or more hub device ports (e.g., port A 105 and port B 106) of the memory hub device 104 as simultaneous and/or independent tests. The one or more commands may target a downstream memory hub device cascade interconnected to the downstream bus, such as on DIMM 503c with respect to DIMM 503b of FIG. 3. The one or more commands may also or alternatively target an upstream memory hub device cascade interconnected to the upstream bus, such as on DIMM 503a with respect to DIMM 503b of FIG. 3. At the targeted memory hub device 104, test logic 126 may be utilized to perform the tests. For example, commands can target MBIST apparatus 401, CCD logic 532, BTM logic 416, CCS 404, and trigger logic 429 among other portions of the test logic 126. Additionally, the commands can initiate a mode change and invoke mode logic, such as transparent mode logic 410, LAI mode logic 412, or configure the memory hub device 104 in wrap mode.

At block 1106, upon running the one or more tests, one or more test results are reported. The results can include basic status indicators captured in the configuration registers 414 and/or status registers 541 and 551. The results may also include more detailed information captured in the trace array 408 and/or error logs 533 and 543. Reporting can be performed to the memory controller 110 via bus 114 or to test equipment 214 via the service interface 124. In an alternate embodiment, remapping of defined signals of the downstream and/or upstream bus is performed as part of the reporting, which can provide visibility of otherwise inaccessible signals.

Figure 12:
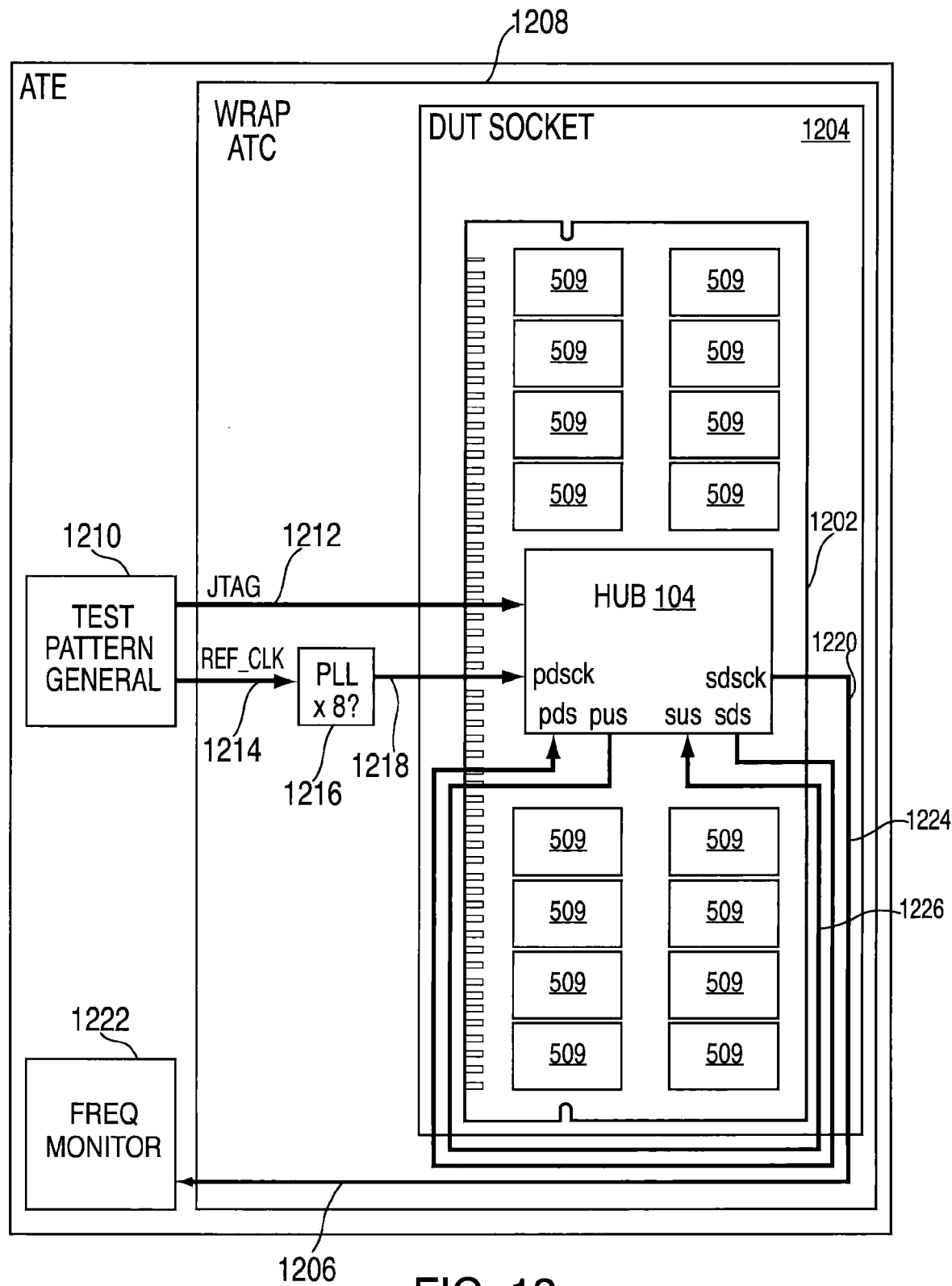
FIG. 12 is an example of a wrap configuration for testing a memory sub-system which includes a hub device.

FIG. 12 is an example of a wrap configuration for testing the memory hub device 104 and a memory module 1202. The wrap configuration in FIG. 12 may be supported using mode registers 1010, informing the memory hub device 104 to initiate operations in response to commands received from an external test device over one or more of the local subsystem bus interfaces (e.g., via a JTAG, FSI, I2C or other low speed bus) then "wrapped" (e.g., hub 104 transmitter outputs connected to the hub 104 receiver inputs) enabling the hub device to verify the functionality of the high speed interface(s) when the memory system and/or a memory tester capable of communicating with the hub device using the high speed busses is not available. In this innovative mode, the memory hub device, tested independently and/or when attached to a memory subsystem (e.g. when attached to a memory module) can compare information transmitted by the hub device 104 (e.g., via primary upstream and/or secondary upstream bus interfaces) to information received by the memory module 1202 (e.g., via primary downstream and secondary downstream bus interfaces) such that both internal and external operation and communication can be evaluated by the hub device 104. With this method, very high cost and/or specialized testers need not be purchased and/or adapted to the memory subsystem to permit bring-up and test of the memory hub device 104 and/or module 1202. As depicted in FIG. 12, a memory module 1202 comprising a hub device 104 can be coupled to a device under test (DUT) socket 1204 of a wrap automated test card 1206, which is interfaced to automated test equipment 1208. A test pattern generator 1210 can send patterns via a JTAG (and/or other previously defined) interface 1212 to the service interface 124 of the memory module 1202. In the exemplary embodiment, the test pattern generator 1210 will also send a reference clock 1214 that is stepped-up by a configurable PLL 1216 on the wrap automated test card to drive a higher speed primary downstream clock 1218 to the memory module 1202. The clock is re-driven downstream as secondary downstream clock 1220, which can be monitored and/or verified using a frequency monitor 1222. Secondary downstream bus signal outputs 1224 can be wrapped to the primary downstream inputs and primary upstream bus signal outputs 1226 can be wrapped to the secondary upstream bus inputs. Thus a high degree of verification can be achieved using only a single memory module 1202 and/or hub device 104 without additional memory modules or a memory controller. Other interconnection methods for the innovative wrap test function can be implemented to minimize complexity with a particular hub and/or memory module design implementation.

Figure 13:
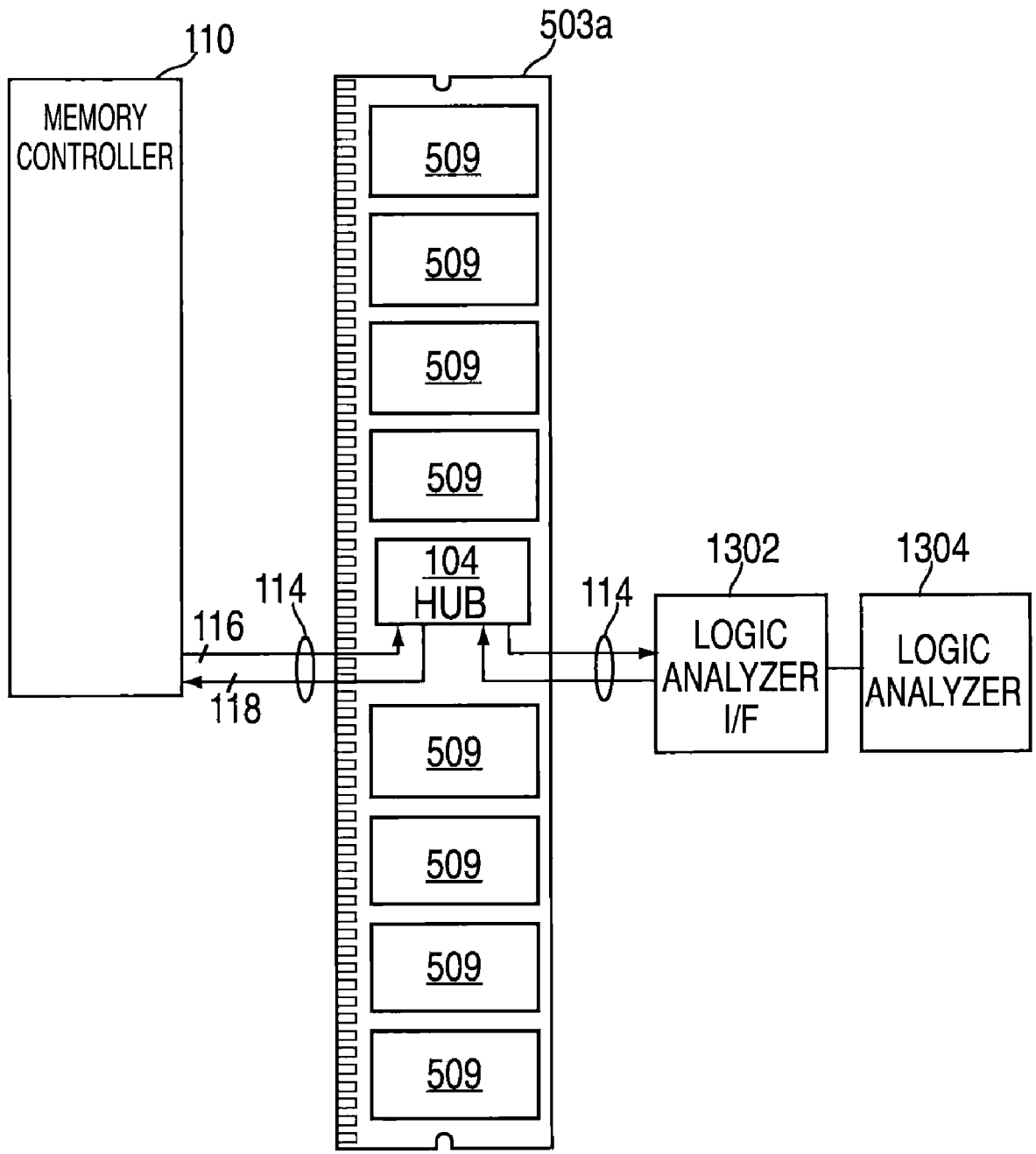
FIG. 13 illustrates a logic analyzer interface to enable observation of a high-speed memory channel in exemplary embodiments.

FIG. 13 illustrates a logic analyzer interface to observe a high-speed memory channel. In an exemplary embodiment, a logic analyzer interface 1302 is connected to the bus 114 downstream of DIMM 503a. The logic analyzer interface circuitry 1302 may reside in the memory hub device 104 or be independent of the hub device 104 and be installed in a socket—with either implementation enabling communication between the DIMM 503a and logic analyzer 1304. In an exemplary embodiment, LAI mode logic 412 in hub device 104 of FIG. 4 can perform signal mapping to the logic analyzer 1304—selecting specific signals to be monitored via the secondary upstream and downstream busses of the hub device 104 that may otherwise be inaccessible and/or unable to be captured by the logic analyzer. For example, LAI mode logic 412 can make signals from port A 105 and/or B 106 available to the logic analyzer 1304. The LAI mode logic 412 may also echo signals it samples and re-drives from the memory controller 110. The echoed signals can be de-serialized, descrambled and repaired by lane sparing. A 4:1 ratio in the clock adjustment logic 128 may be used to de-serialize the received signals, resulting in slower transitions to support capture requirements of the logic analyzer 1304. Along with the upstream and downstream signals, the memory hub device 104 may output additional information, such as indicating a block number currently being observed.

Figure 14:
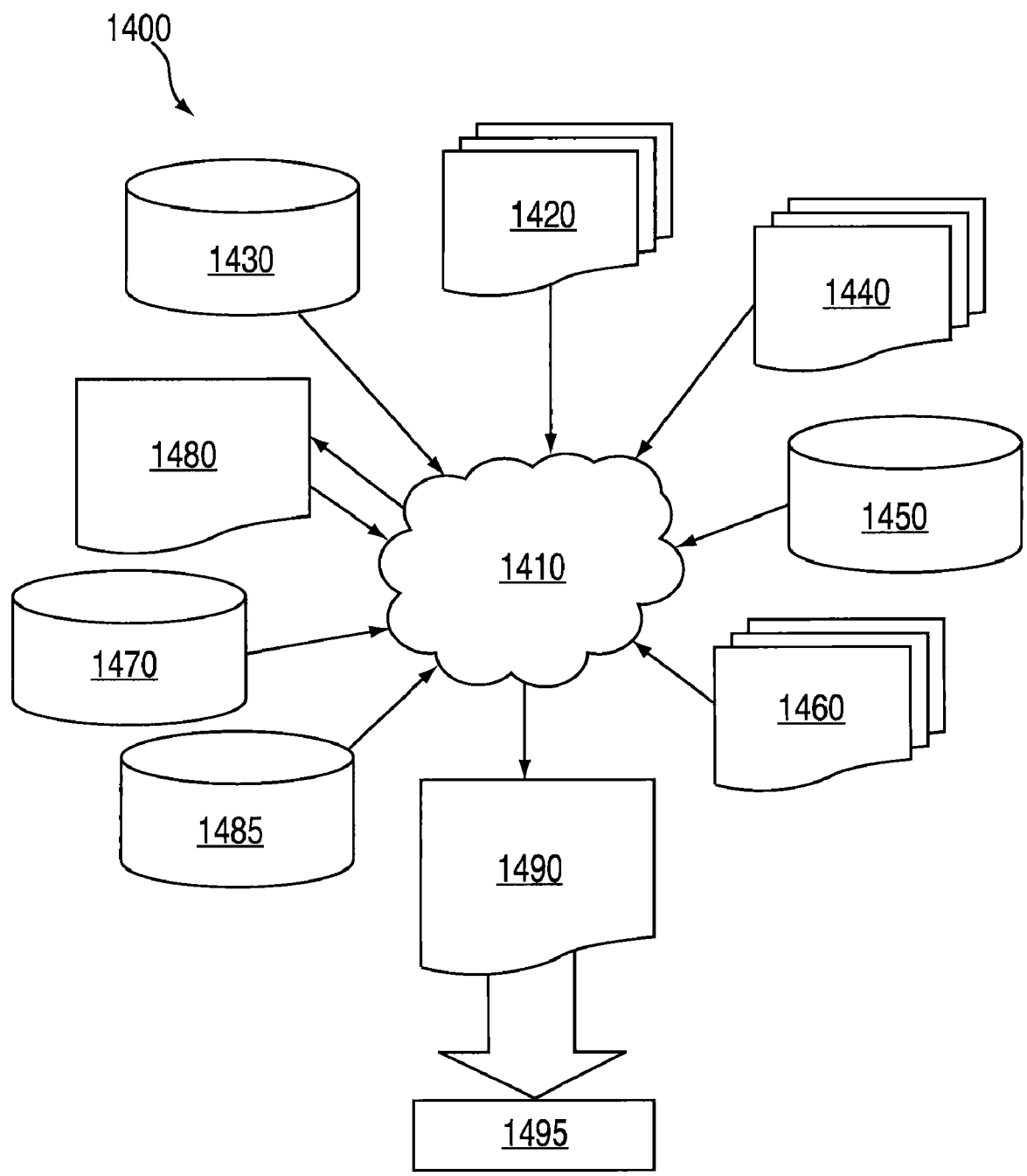
FIG. 14 is a flow diagram of a design process used in semiconductor design, manufacture, and/or test.

FIG. 14 shows a block diagram of an exemplary design flow 1400 used for example, in semiconductor IC logic design, simulation, test, layout, and manufacture. Design flow 1400 includes processes and mechanisms for processing design structures or devices to generate logically or otherwise functionally equivalent representations of the design structures and/or devices described above and shown in FIGS. 1-13. The design structures processed and/or generated by design flow 1400 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 1400 may vary depending on the type of representation being designed. For example, a design flow 1400 for building an application specific IC (ASIC) may differ from a design flow 1400 for designing a standard component or from a design flow 1400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1420 that is preferably processed by a design process 1410. Design structure 1420 may be a logical simulation design structure generated and processed by design process 1410 to produce a logically equivalent functional representation of a hardware device. Design structure 1420 may also or alternatively comprise data and/or program instructions that when processed by design process 1410, generate a functional representation of the physical structure of a hardware device. Whether representing functional and/or structural design features, design structure 1420 may be generated using electronic computer-aided design (ECAD) such as implemented by a core developer/designer. When encoded on a machine-readable data transmission, gate array, or storage medium, design structure 1420 may be accessed and processed by one or more hardware and/or software modules within design process 1410 to simulate or otherwise functionally represent an electronic component, circuit, electronic or logic module, apparatus, device, or system such as those shown in FIGS. 1-13. As such, design structure 1420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1410 preferably employs and incorporates hardware and/or software modules for synthesizing, translating, or otherwise processing a design/simulation functional equivalent of the components, circuits, devices, or logic structures shown in FIGS. 1-13 to generate a netlist 1480 which may contain design structures such as design structure 1420. Netlist 1480 may comprise, for example, compiled or otherwise processed data structures representing a list of wires, discrete components, logic gates, control circuits, I/O devices, models, etc. that describes the connections to other elements and circuits in an integrated circuit design. Netlist 1480 may be synthesized using an iterative process in which netlist 1480 is resynthesized one or more times depending on design specifications and parameters for the device. As with other design structure types described herein, netlist 1480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1410 may include hardware and software modules for processing a variety of input data structure types including netlist 1480. Such data structure types may reside, for example, within library elements 1430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1440, characterization data 1450, verification data 1460, design rules 1470, and test data files 1485 which may include input test patterns, output test results, and other testing information. Design process 1410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1410 without deviating from the scope and spirit of the invention. Design process 1410 may also include modules for performing standard circuit design processes such as timing analysis, verification, design rule checking, place and route operations, etc.

Design process 1410 employs and incorporates logic and physical design tools such as HDL compilers and simulation model build tools to process design structure 1420 together with some or all of the depicted supporting data structures along with any additional mechanical design or data (if applicable), to generate a second design structure 1490. Design structure 1490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1420, design structure 1490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-13. In one embodiment, design structure 1490 may comprise a compiled, executable HDL simulation model that functionally simulates the devices shown in FIGS. 1-13.

Design structure 1490 may also employ a data format used for the exchange of layout data of integrated circuits and/or symbolic data format (e.g. information stored in a GDSII (GDS2), GL1, OASIS, map files, or any other suitable format for storing such design data structures). Design structure 1490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-13. Design structure 1490 may then proceed to a stage 1495 where, for example, design structure 1490: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The capabilities of the present invention can be implemented in software, firmware, hardware or some combination thereof As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Technical effects include the enablement and/or facilitation of test, initial bring-up, characterization and/or validation of a memory subsystem designed for use in a high-speed, high-reliability memory system. Test features may be integrated in a memory hub device capable of interfacing with a variety of memory devices that are directly attached to the hub device and/or included on one or more memory subsystems including UDIMMs and RDIMMs, with or without further buffering and/or registering of signals between the memory hub device and the memory devices. The test features reduce the time required for checking out and debugging the memory subsystem and in some cases, may provide the only known currently viable method for debugging intermittent and/or complex faults. Furthermore, the test features enable use of slower test equipment and provide for the checkout of system components without requiring all system elements to be present.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A memory hub device with test logic, the memory hub device configured to communicate with memory devices via multiple hub device ports and configured to communicate on one or more busses in an upstream and downstream direction, the test logic comprising:
   a configured command sequencer (CCS) to launch an architected command to a target device configurable between local execution of the architected command at the memory hub device and remote execution at one or more of: a downstream memory hub device and an upstream memory hub device; and
   configuration registers to hold fault and diagnostic information, and to initiate one or more tests.

2. The memory hub device of claim 1 wherein the one or more busses in the upstream and downstream directions are comprised of upstream and downstream segments, and the CCS is configured to drive separate multi-bit patterns on the upstream and downstream segments.

3. The memory hub device of claim 1 wherein the CCS configures the memory hub device to initiate testing on a cascaded memory hub device in communication with one or more of: the downstream memory hub device and the upstream memory hub device.

4. A method of testing an enhanced cascade interconnected memory system, comprising:
   receiving one or more commands at a memory hub device from one or more of: a downstream bus, an upstream bus, and a service interface;
   configuring one or more configuration registers to initiate one or more tests in response to the one or more commands, wherein the one or more commands target one or more of:
      memory devices interfaced to two or more hub device ports of the memory hub device as one or more of simultaneous and independent tests;
      a downstream memory hub device cascade interconnected to the downstream bus; and
      an upstream memory hub device cascade interconnected to the upstream bus; and
   reporting one or more results of the one or more tests, wherein a built-in self test (MBIST) apparatus in the memory hub device provides logic to test the memory devices interfaced to the two or more hub device ports using read and write data patterns, and further wherein the memory hub device includes command collision detection (CCD) logic to monitor for timing violations, and set a fault indicator in the configuration registers in response to detecting at least one of the timing violations.

5. A method of testing an enhanced cascade interconnected memory system, comprising:
   receiving one or more commands at a memory hub device from one or more of: a downstream bus, an upstream bus, and a service interface;
   configuring one or more configuration registers to initiate one or more tests in response to the one or more commands, wherein the one or more commands target one or more of:
      memory devices interfaced to two or more hub device ports of the memory hub device as one or more of simultaneous and independent tests;
      a downstream memory hub device cascade interconnected to the downstream bus; and
      an upstream memory hub device cascade interconnected to the upstream bus; and
   reporting one or more results of the one or more tests, wherein the memory hub device further comprises a configured command sequencer (CCS) to launch an architected command in response to the one or more commands to a target device configurable between local execution of the architected command at the memory hub device and remote execution at one or more of: the downstream memory hub device and the upstream memory hub device.

6. A design structure tangibly embodied in a machine-readable medium for designing, manufacturing, or testing an integrated circuit, the design structure comprising:
   a configured command sequencer (CCS) to launch an architected command to a target device configurable between local execution of the architected command at a memory hub device and remote execution at one or more of: a downstream memory hub device and an upstream memory hub device; and
   configuration registers to hold fault and diagnostic information, and to initiate one or more tests.

7. The design structure of claim 6, wherein the design structure comprises a netlist.

8. The design structure of claim 6, wherein the design structure resides on a storage medium as a data format used for the exchange of layout data of integrated circuits.

9. The design structure of claim 6, wherein the design structure resides in a programmable gate array.

* * * * *